US012652791B2

(12) United States Patent
Sharma et al.

(10) Patent No.: US 12,652,791 B2
(45) Date of Patent: Jun. 9, 2026

(54) SINGLE PATTERNING CYLINDRICAL TRANSISTOR AND CAPACITOR DYNAMIC RANDOM ACCESS MEMORY

(71) Applicant: Intel Corporation, Santa Clara, CA (US)

(72) Inventors: Abhishek Sharma, Portland, OR (US); Tahir Ghani, Portland, OR (US); Wilfred Gomes, Portland, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 17/856,866

(22) Filed: Jul. 1, 2022

(65) Prior Publication Data

US 2024/0008251 A1     Jan. 4, 2024

(51) Int. Cl.
*H10B 12/00* (2023.01)
*H10W 40/73* (2026.01)

(52) U.S. Cl.
CPC ............. *H10B 12/30* (2023.02); *H10B 12/03* (2023.02); *H10B 12/05* (2023.02); *H10B 12/50* (2023.02); *H10W 40/73* (2026.01)

(58) Field of Classification Search
CPC ........ H10B 12/30; H10B 12/03; H10B 12/05; H10B 12/50; H01L 23/427; H10D 1/716

USPC .......................................................... 257/296
See application file for complete search history.

(56) References Cited

U.S. PATENT DOCUMENTS

| | | | | |
|---|---|---|---|---|
| 2021/0257370 A1* | 8/2021 | Son | .......................... | H10B 12/03 |
| 2021/0366819 A1* | 11/2021 | Chiang | ................. | H01L 23/445 |
| 2022/0045094 A1* | 2/2022 | Lee | .......................... | H10B 41/35 |
| 2022/0199621 A1* | 6/2022 | Lee | .......................... | H10B 12/03 |
| 2023/0103424 A1* | 4/2023 | Xu | .......................... | H10B 12/033 |
| | | | | 257/296 |

* cited by examiner

*Primary Examiner* — Mounir S Amer
*Assistant Examiner* — Nicholas B Michaud
(74) *Attorney, Agent, or Firm* — Essential Patents Group, LLP

(57) ABSTRACT

Integrated circuit dies, systems, and techniques are described herein related to one transistor-one capacitor dynamic random access memory. A memory device includes vertically aligned transistors having annular semiconductor structures and a shared bit line extending through the annular semiconductor structures, and vertically aligned capacitors having annular first capacitor plates, annular capacitor dielectric structures, and a shared second capacitor plate extending through the annular first capacitor plates, such that the annular first capacitor plates are in contact with corresponding ones of the annular semiconductor structures.

23 Claims, 19 Drawing Sheets

600

700

800

763

662

768

802
801
M12
653

803

M11

652

M10
654

M9

M8

M7

M6

M5

664

M4/V3

M3/V2

M2/V1

M1

V0    M0
C1
C0

240

BM0

BM1

651

654

BM2

665

MIM

653
BM3

655

667

Bump

Figure 10:
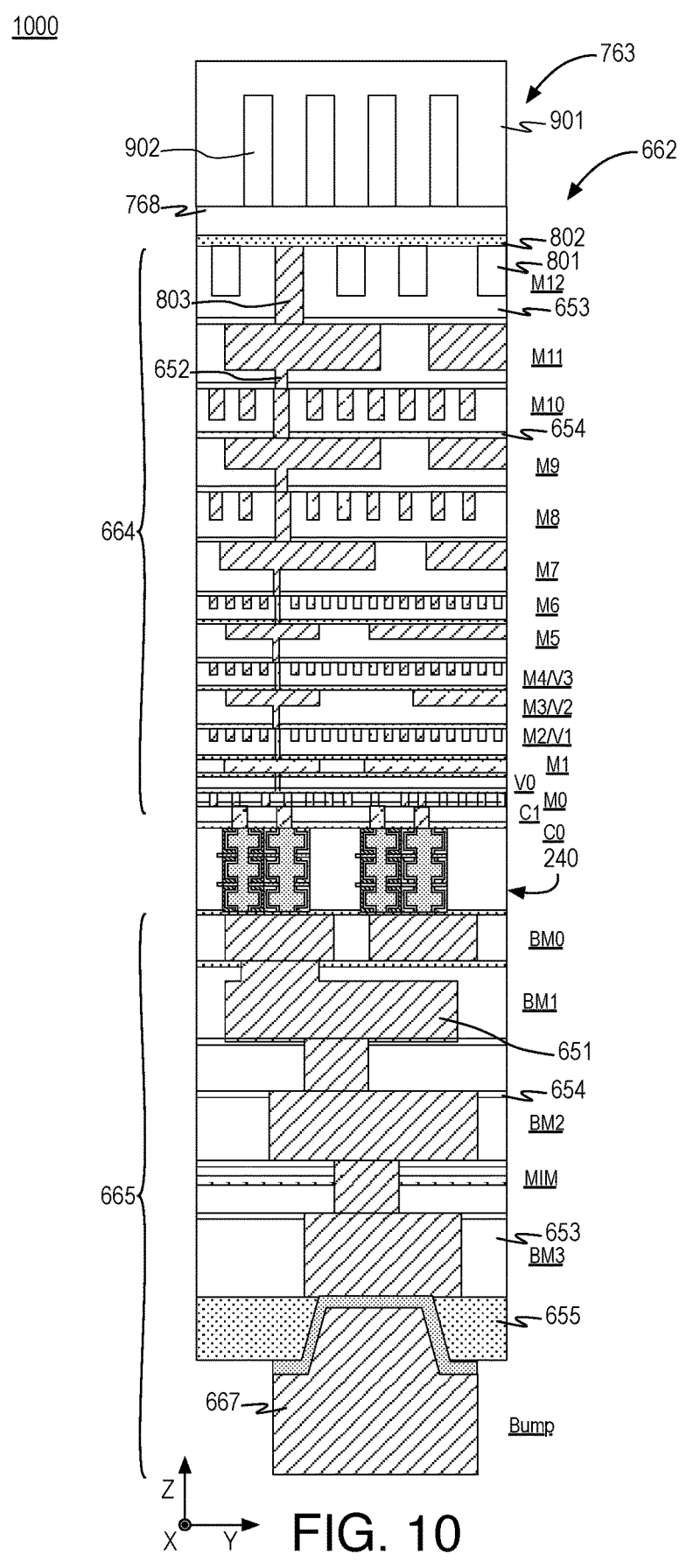

1000

763

902 — 901

768 —

662

802
801
M12
653

803 —

652 —

M11

M10
654

M9

M8

664

M7

M6

M5

M4/V3

M3/V2

M2/V1

M1

V0   M0
C1

C0
240

BM0

BM1

651

654

BM2

665

MIM

653
BM3

655

667 —

Bump

SINGLE PATTERNING CYLINDRICAL TRANSISTOR AND CAPACITOR DYNAMIC RANDOM ACCESS MEMORY

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. In particular, dynamic random access memory (DRAM) may deploy a single transistor and a single capacitor in each memory cell, and DRAM units may be implemented in a wide array of computational contexts. There is an ongoing desire to further condense DRAM for increased efficiency, and other advantages.

It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 10 illustrates a cross-sectional view of a low temperature one transistor-one capacitor dynamic random access memory integrated circuit system using die level and package level cooling;

DETAILED DESCRIPTION

Figures 1A, 1B:
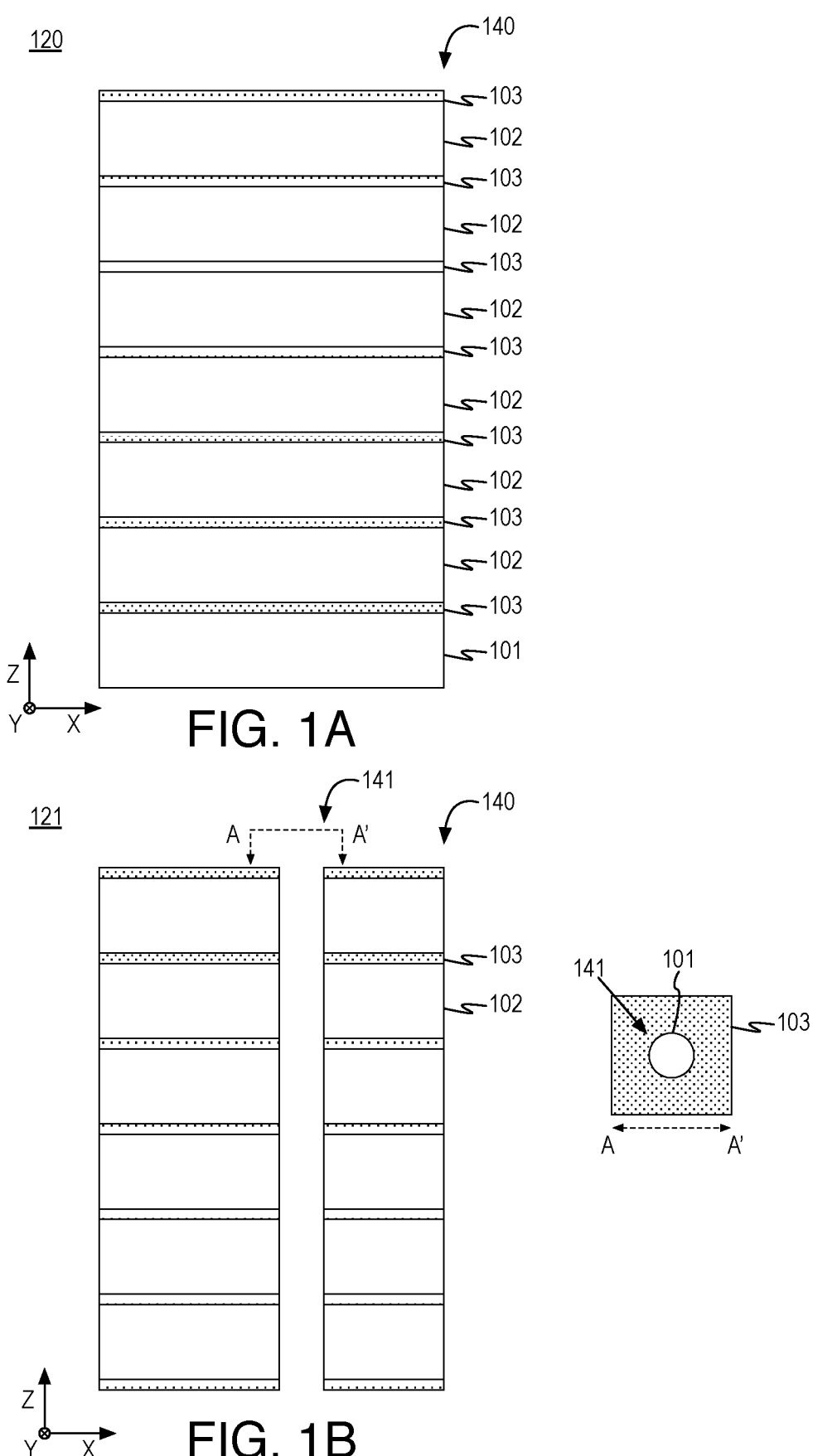
FIGS. 1A, 1B, 1C, 1D, 1E, 1F, 1G, 1H, 1I, 1J, 1K, 1L, 1M, and 1N illustrate example memory structures as selected fabrication operations are performed.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. The term "aligned" (i.e., vertically or laterally) indicates at least a portion of the components are aligned in the pertinent direction while "fully aligned" indicates an entirety of the components are aligned in the pertinent direction. As used herein, the term predominantly indicates the predominant constituent (i.e., greater than 50% is the constituent of greatest proportion in the layer or material). The term substantially pure indicates the constituent is not less than 99% of the material. The term pure indicates the constituent is not less than 99.5% of the material and the term completely pure indicates the constituent is not less than 99.9% of the material. As used herein, the terms "monolithic", "monolithically integrated", and similar terms indicate the components of the monolithic overall structure form an indivisible whole not reasonably capable of being separated.

Integrated circuit dies, systems, circuits, and techniques are described herein related to dynamic random access memory having vertically aligned transistors with separate annular semiconductor structures and a shared word line extending through the annular semiconductor structures coupled to vertically aligned capacitors with separate annular capacitor plates and annular capacitor dielectric structures and a shared capacitor plate extending through the annular capacitor plates.

Embodiments discussed herein provide for one transistor-one capacitor dynamic random access memory (1T-TC DRAM) that offers advantages inclusive of increased density. Notably, the vertically aligned transistors each include an annular semiconductor structure while sharing a gate or word line that extends through the annular semiconductor structures, with a gate dielectric material therebetween. Each of the annular semiconductor structures is in contact with an annular plate of a corresponding capacitor such that the abutting semiconductor structure and capacitor plate couple the 1T-1C cell of the DRAM memory array. As used herein, the term annular indicates a structure, material, etc. that has a substantially ring shape. The annular structure may have any suitable cross section across the annulus. For example, the outer edge of the annular structure may be relatively flat while the inner edge may be relatively flat or it may include a section that extends from a relatively flat inner edge.

Each of the annular semiconductor structures is contacted by an independent bit line. As used herein, the term independent with respect to an electrical component such as a bit line, electrode, or the like indicates the component is separately controllable. In contrast, a shared gate electrode or word line extends through each of the annular semiconductor structures such that the gates of each of the transistors are shared. As used herein, the term shared with respect to an electrical component such as a word line, electrode, or the like indicates the components across which the electrical component is shared may only be controlled together. Each of the transistors are coupled to a corresponding one of the capacitors in a 1T-1C fashion. For example, each of the annular semiconductor structures is abutted against and in contact with an annular plate of a corresponding capacitor. Herein, the annular plate may be characterized as a first plate, first capacitor plate, bottom plate (as adjacent to the transistor), or the like. It is noted only this plate is annular while the second, shared plate is substantially cylindrical in shape. The second, shared plate may be characterized as a second plate, second capacitor plate, top plate (as opposite the capacitor dielectric with respect to the transistor), or the like. As discussed, the second plate is shared and extends through each of the annular capacitor plates. For example, the second plate may be coupled to a shared ground. Thereby, the discussed multiple transistors and multiple capacitor architecture provides a 1T-TC DRAM that may be deployed in any suitable context or device.

In some embodiments, the devices or systems including the 1T-TC DRAM are deployed at very low temperatures, such as at or below 0° C. In some embodiments, very low temperature deployment allows for smaller capacitor structures such as capacitor structures having the same or similar lateral dimensions with respect to the transistor structures. In some embodiments, the annular semiconductor structures have a first lateral width, and the annular first capacitor plates have a second lateral width not more than 1.5 times the first lateral width. Other dimensional ratios may be used. For example, in current 1T-TC DRAM systems, the ratio of the height of the transistor to the height of the capacitor may be in the range of about 1:5 or 1:20. Transitioning to the vertical alignment discussed herein provides a variety of advantages in terms of packing density and layout efficiency that may be improved on further with deployment at low temperatures where the capacitor structures have improved efficiency, greatly reduced leakage, and other advantages that may allow for the capacitor structures having the same or similar lateral dimensions with respect to the transistor structures.

In some embodiments, the 1T-TC DRAM is implemented in an integrated circuit (IC) die including or coupled to a cooling structure operable to remove heat from the IC die to achieve an operating temperature at the very low temperature. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC die and/or provided separately from the IC die. In some contexts, an active cooling structure is not needed as the IC die is deployed in a very low temperature environment such as in any of a subpolar oceanic climate, a subarctic climate, an arctic climate, a tundra climate, an ice cap climate, or any other environment of sustained cold temperatures. In some embodiments, the discussed transistors are implemented in room temperature (or room temperature devices) without use of such cooling structures (although typical cooling techniques such as heat sinks may be used).

In some embodiments, a memory device includes a number of vertically aligned transistors, each of the transistors including an annular semiconductor structure coupled to an independent bit line, the transistors further including a shared word line extending vertically through each of the annular semiconductor structures. The memory device also includes a number of vertically aligned capacitors, each of the capacitors including an annular first capacitor plate surrounding an annular capacitor dielectric, such that each of the annular first capacitor plates are in contact with one of the annular semiconductor structures, the capacitors further including a shared second capacitor plate extending vertically through each of the annular gate dielectric structures and the surrounding annular first capacitor plates. Further details of such memory devices are discussed further herein with respect to the operations used to form them.

As discussed, an IC die including the 1T-TC DRAM may be deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on. In operation at such very low temperatures, the 1T-TC DRAM may exhibit a substantial boost in performance relative to operation at higher temperatures inclusive of increased carrier mobility, reduced contact resistance, reduced leakage, and others.

FIGS. 1A, 1B, 1C, 1D, 1E, 1F, 1G, 1H, 1I, 1J, 1K, 1L, 1M, and 1N illustrate example memory structures as selected fabrication operations are performed, arranged in accordance with at least some implementations of the present disclosure. FIG. 1A illustrates a cross-sectional view of an example memory structure 120. As shown, processing begins with forming or receiving a multilayer stack 140 including interleaved first layers 102 and second layers 103 such that first layers 102 and second layers 103 have an etch selectivity therebetween. As used herein the term etch selectivity indicates an etch that removes all or nearly all of a first material while providing little or no removal of a second material and/or an etch that removes the first material at a substantially greater rate than the second material (e.g., a rate of 5×, 10×, or more). In some embodiments, first layers 102 are or include silicon oxide (e.g., include silicon and oxygen) and second layers 103 are or include silicon nitride (e.g., include silicon and nitrogen). However, any suitable material systems may be deployed. Furthermore, although illustrated with respect to first layers 102 and second layers 103 being directly one another, in accordance with some embodiments, other intervening layers may be used. In some embodiments, first layers 102 are characterized as dielectric layers and second layers 103 are characterized as etch stop layers. First layers 102 and second layers 103 may be formed using any suitable technique or techniques such as chemical vapor deposition (CVD), plasma chemical vapor deposition (PCVD), plasma enhanced chemical vapor deposition (PCVD), or the like. First layers 102 and second layers 103 may have any suitable thicknesses. In some embodiments, first layers 102 have thicknesses in the range of 20 to 100 nm. In some embodiments, second layers 103 have thicknesses in the range of to 20 nm. Each of first layers 102 may have the same thicknesses or they may be different. Similarly, each of second layers 103 may have the same thicknesses or they may be different.

As shown, first layers 102 and second layers 103 may be formed over an entirety of a substrate 101. Substrate 101 may include any suitable material or materials. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire (Al$_2$O$_3$), or any combination thereof. In some examples, substrate 101 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 101 may be (111) silicon, (100) silicon, or (110) silicon. In an embodiment, substrate 101 includes a (111) crystalline group IV material. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

FIG. 1B illustrates a cross-sectional view and a top down view A-A' of an example memory structure 121. Memory structure 121 is similar to memory structure 120, after the formation of through via 141. In FIG. 1B, and in subsequent FIGURES, substrate 101 is not shown in cross-sectional views for the sake of clarity of presentation. As shown, via 141 extends vertically through all of first layers 102 and second layers 103. As used herein, the term vertical and similar terms indicates a direction orthogonal to a plane of substrate 101 and in the direction of buildup of the device layers. The term lateral is parallel to the plane of substrate 101 and in a direction orthogonal to the vertical direction. For example, the lateral direction is any direction substantially parallel to the x-y plane.

Via 141 may be formed using any suitable technique or techniques. In some embodiments, a photoresist is patterned on or over top surface of multilayer stack 140, an anisotropic dry etch is performed, and the photoresist is removed. In some embodiments, the dry etch is a multi-step etch using chemistries suitable to etching first layers 102 and other chemistries suitable to etching second layers 103 in an alternating manner. However, chemistries suitable to etching both first layers 102 and second layers 103 are available. As shown in the top down view of FIG. 1B, via 141 may have a substantially circular cross section shape and a substantially cylindrical 3D shape. Via 141 may have any suitable diameter in the x-y plane such as a diameter in the range of 20 to 300 nm, a diameter in the range of 10 to 100 nm, or a diameter in the range of about 5 to 50 nm. Other dimensions may be used.

Figures 1C, 1D:
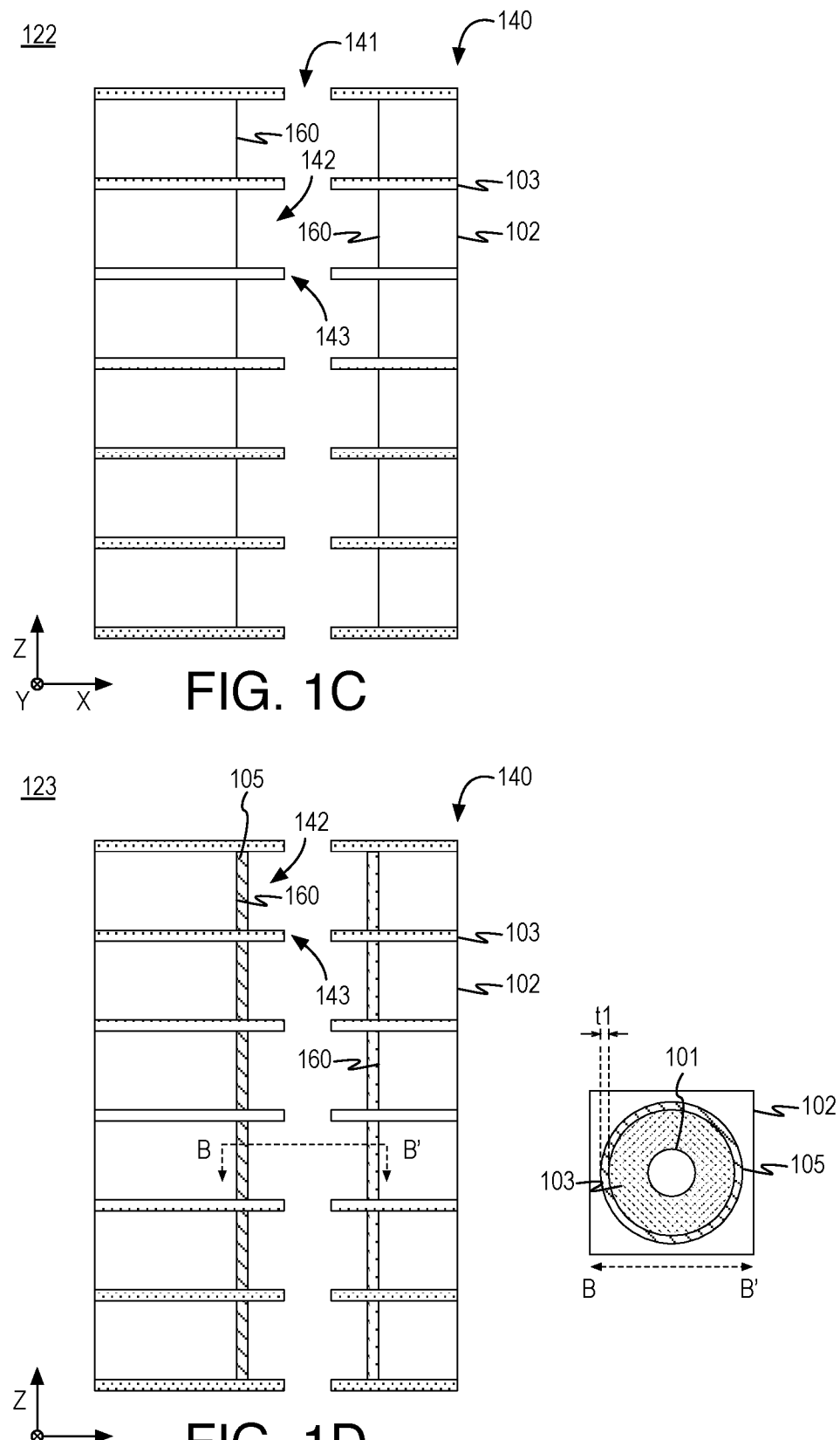

FIG. 1C illustrates a cross-sectional view of an example memory structure 122, which is similar to memory structure 121, after the selective etch of regions of first layers 102 to form expanded annular regions 142. As shown, expanded annular regions 142 provide a greater void laterally from via 141 such that portions 143 of second layers 103 separate expanded annular regions 142. Expanded annular regions 142 may be provided using any suitable technique or techniques. In some embodiments, expanded annular regions 142 are provided using a timed selective wet etch that removes portions of first layers 102 without substantial removal of second layers 103 (e.g., first layers 102 are removed more rapidly than second layers 103). Expanded annular regions 142 may have any suitable diameters in the x-y plane and/or relative dimensions to those of via 141. In some embodiments, expanded annular regions 142 have a diameter in the range of 60 to 600 nm, a diameter in the range of 20 to 200 nm, or a diameter in the range of about 10 to 100 nm. Other dimensions may be used. Furthermore, the ratio of the diameter of expanded annular regions 142 to the diameter of via 141 may be, for example, about 4:1, about 3:1, or about 2:1. Other ratios greater than one may be used.

As shown, portions 143 of second layers 103 extend beyond newly formed sidewalls 160. For example, portions 143 of second layers 103 extend toward an interior of via 141. The newly formed void defined by via 141 and expanded annular regions 142 define a generally cylindrical 3D shape that includes a vertically aligned and an alternating interleaved stack of cylinders having larger diameters (and larger heights) and of cylinders having smaller diameters (and smaller heights). It is noted that the larger diameter and height cylinders will be used to form independent and separate transistor portions while the smaller diameter and height cylinders will be used to interconnect the separate transistor portions. As used herein, the term transistor or transistor structure indicates a device having semiconductor structure (or channel) that is controllable by a gate electrode or word line. The semiconductor structure may couple to source and drain electrodes to form a three terminal device. Herein, the gate electrode of each transistor is a portion of a shared word line, one of the source or drain is or is coupled to a bit line, and the other of the source or drain is or is coupled to a capacitor plate.

FIG. 1D illustrates a cross-sectional view and a second, vertically facing cross-sectional view of an example memory structure 123, which is similar to memory structure 122, after the selective formation of annular semiconductor structures 105 on sidewalls 160 of first layers 102. In the context of FIG. 1D, annular semiconductor structures 105 are formed by selective deposition such that annular semiconductor structures 105 are formed on sidewalls 160 of first layers 102 without being formed on exposed portions 143 of second layers 103. Annular semiconductor structures 105 may be formed using any suitable selective deposition technique or techniques epitaxial deposition techniques, atomic layer deposition (ALD) techniques, or the like.

Annular semiconductor structures 105 may include any suitable semiconductor material. In some embodiments, annular semiconductor structures 105 include a Group IV material (e.g., silicon). In some embodiments, annular semiconductor structures 105 include a substantially monocrystalline material. However, other semiconductor materials may be deployed. Annular semiconductor structures 105 may have any suitable dimensions. In some embodiments, annular semiconductor structures 105 have a lateral thickness t1 (i.e., in the x-y plane) in the range of 0.5 to 20 nm. In some embodiments, thickness t1 is in the range of 0.5 to 10 nm. In some embodiments, thickness t1 is in the range of 8 to 20 nm. In particular, as discussed herein, 1T-TC DRAM may advantageously be operated at very cold temperatures such that transistors including annular semiconductor structures 105 operate efficiently with low leakage, high mobility, and other advantages. Such very cold temperatures may allow for efficient operation of annular semiconductor structures 105 having reduced thicknesses. In some embodiments, annular semiconductor structures 105 have a thickness of not more than 2 nm. In some embodiments, annular semiconductor structures 105 have a thickness of not more than 2 nm and a cooling structure is used to remove heat from an IC die including transistors with annular semiconductor structures 105 to achieve an operating temperature of the IC die at or below –25° C. As shown in the vertically facing cross-sectional view B-B', annular semiconductor structures 105 have a substantially annular shape with a circular outer edge and a circular inner edge.

Figure 1E:
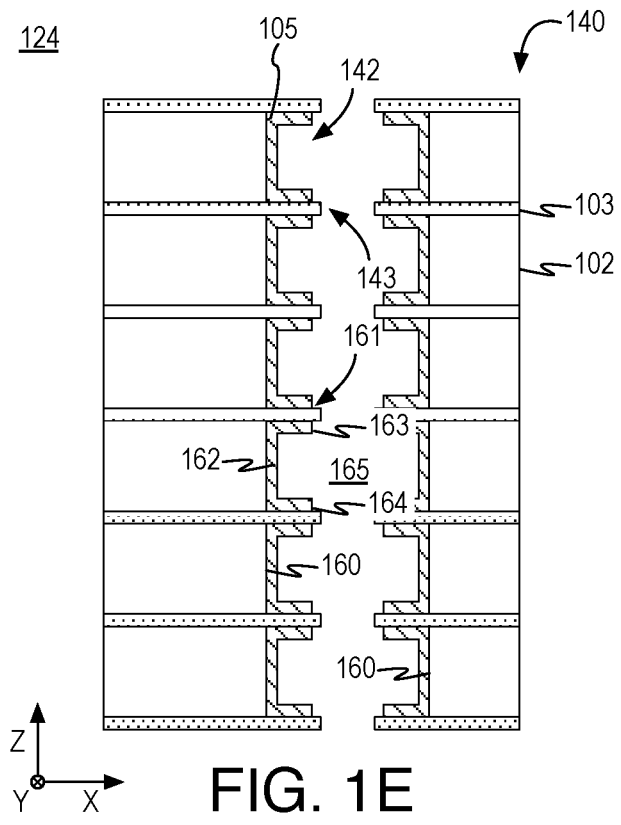

FIG. 1E illustrates a cross-sectional view of an example memory structure 124, which is similar to memory structure 122 of FIG. 1C, after the formation of annular semiconductor structures 105 on sidewalls 160 of first layers 102 and on portions 161 of exposed lateral regions of second layers 103. In the context of FIG. 1E, annular semiconductor structures 105 are formed by blanket deposition of semiconductor material followed by an anisotropic etch to remove unwanted portions of the blanket semiconductor material. For example, semiconductor material is removed from portions 143 of second layers 103 such that vertically aligned transistors (discussed further below) are not shorted between their channels. It is noted that memory structure 124 of FIG. 1E is an alternative technique with respect to memory structure 123 of FIG. 1D. In the following, the example of memory structure 124 of FIG. 1E is used for the sake of clarity of presentation; however, example of memory structure 123 of FIG. 1D may also be used in subsequent operations.

Annular semiconductor structures 105 of memory structure 124 may be formed using any suitable technique or techniques such as a blanket ALD operation followed by anisotropic selective etch to remove slivers of unwanted materials. Annular semiconductor structures 105 may include any suitable semiconductor material and dimensions discussed above. Notably, each annular semiconductor structure 105 of FIG. 1E includes a first portion 162 forming an outer ring of the semiconductor structure, and second and third portions 163, 164 extending from first portion 162 into an interior 165 of the annular semiconductor structure. For example, at a cross section of the annulus, the semiconductor structure has a substantially C shape or a substantially bracket shape.

Figure 1F:
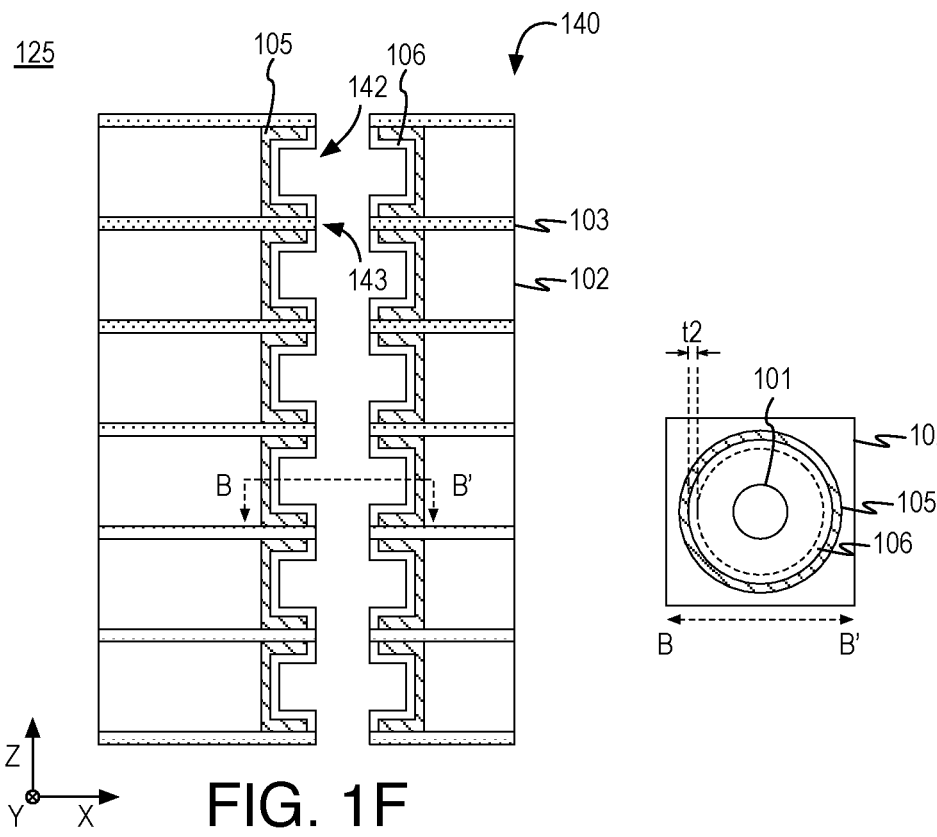

FIG. 1F illustrates a cross-sectional view and a second, vertically facing cross-sectional view of an example memory structure 125, which is similar to memory structure 124, after the formation of gate dielectric structures 106, which may also be characterized as annular gate dielectric structures. Gate dielectric structures 106 may be formed using any suitable technique or techniques such as blanket deposition of gate dielectric material followed by an anisotropic etch to remove unwanted portions of the blanket gate dielectric material. For example, gate dielectric material may be removed from portions 143 of second layers 103. However, it is noted that gate dielectric material bridging across portions 143 will not short vertically aligned transistors and therefore, gate dielectric material may remain on portions 143. In some embodiments, gate dielectric material is on both of and extends between adjacent ones of annular gate dielectric structures 106 (i.e., gate material is on and extends between) a first of the annular gate dielectric structures and a second of the annular gate dielectric structures.

Gate dielectric structures 106 of memory structure 125 may be formed using any suitable technique or techniques such as a blanket ALD operation followed by anisotropic selective etch to remove unwanted materials. The gate dielectric may include one layer or a stack of layers including silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Gate dielectric structures 106 may have any suitable dimensions. In some embodiments, gate dielectric structures 106 have a thickness t2 in the range of 0.5 to 20 nm. In some embodiments, thickness t2 is in the range of 0.5 to 10 nm. In some embodiments, thickness t2 is in the range of 8 to 20 nm. Other thicknesses may be used.

Figures 1G, 1H:
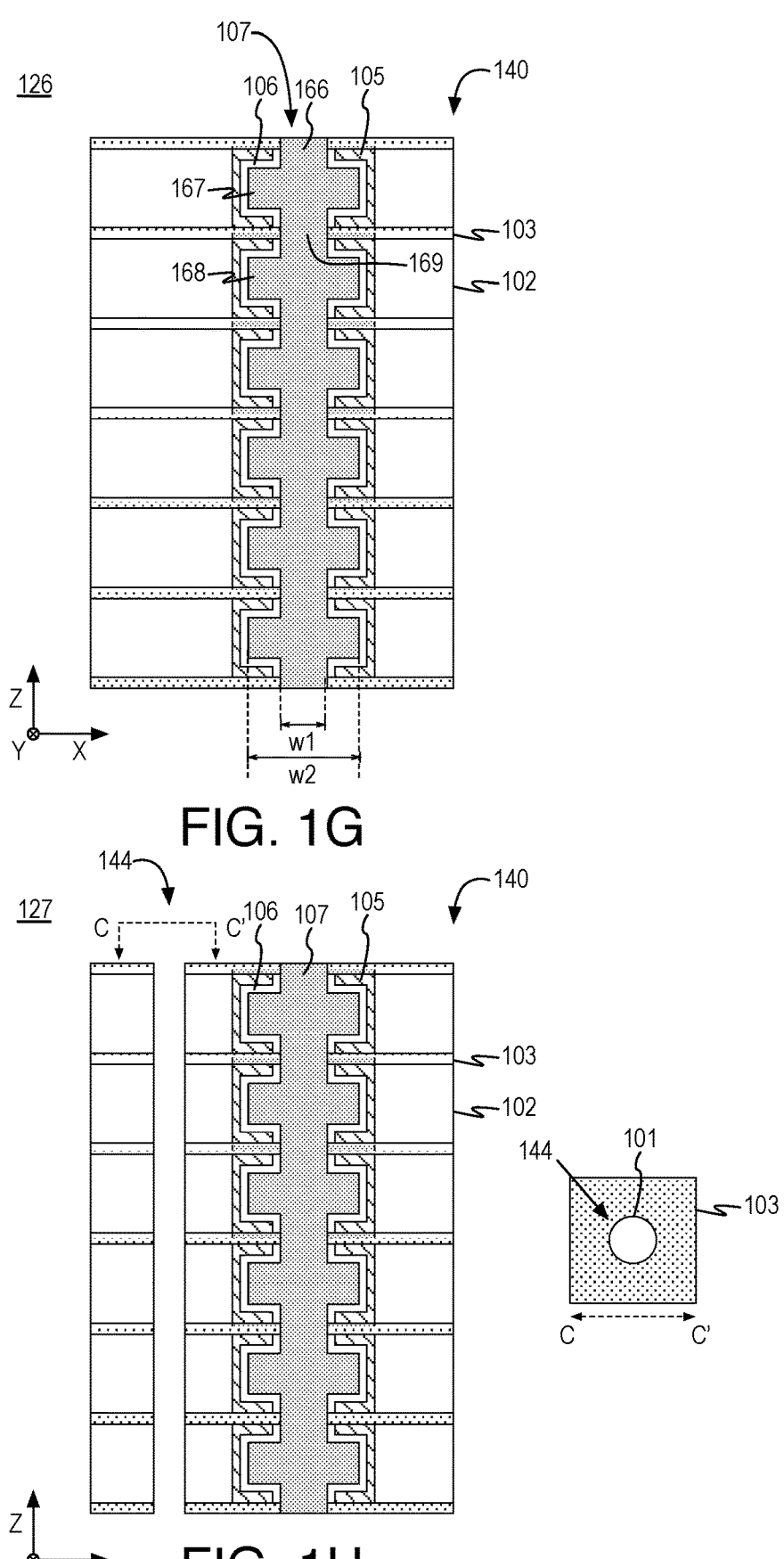

FIG. 1G illustrates a cross-sectional view of an example memory structure 126, which is similar to memory structure 125, after the formation of a gate metal 166 within the remaining voids of via 141 to provide a shared word line 107. As discussed, word line 107 also provides a gate electrode for each of a number vertically aligned transistors. Therefore, word line 107 may be characterized as a bit line, a shared bit line, a shared gate electrode, or the like. Gate metal 166 may be formed using any suitable technique or techniques such as fill deposition techniques followed by planarization techniques.

Gate metal 166 may include any suitable gate material. For example, gate metal 166 may include at least one p-type work function metal or n-type work function metal, depending on whether the transistors are to be PMOS or NMOS transistors. In some embodiments, the gate electrode includes a stack of two or more metal layers, where one or more metal layers are work function metal layers and at least one metal layer is a fill metal layer. For PMOS transistors, metals that may be used for the gate electrode include, but are not limited to, ruthenium, palladium, platinum, cobalt, nickel, and conductive metal oxides, e.g., ruthenium oxide.

For NMOS transistors, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

As shown, word line 107 extends vertically through each of annular semiconductor structures 105, and word line 107 is separated from each of annular semiconductor structures 105 by gate dielectric structures 106. Word line 107 includes a first portion 167 adjacent a first of annular semiconductor structures 105, a second portion 168 adjacent a second of annular semiconductor structures 105, and a third portion 169 between first portion 167 and second portion 168 such that third portion 169 has a lateral width w1 (or diameter) less than a lateral width w2 (or diameter) of first portion 167 and less than a lateral width w2 (or diameter) of second portion 168.

FIG. 1H illustrates a cross-sectional view and a top down view C-C' of an example memory structure 127, is similar to memory structure 126, after the formation of through via 144. As shown, via 144 extends vertically through all of first layers 102 and second layers 103, and via 144 is adjacent to the structures formed prior. Via 144 may be formed using any suitable technique or techniques discussed with respect to FIG. 1B. For example, a photoresist may be patterned on or over top surface of multilayer stack 140, an anisotropic dry etch may be performed, and the photoresist may be removed. In some embodiments, the dry etch is a multi-step etch using chemistries suitable to etching first layers 102 and other chemistries suitable to etching second layers 103 in an alternating manner. However, chemistries suitable to etching both first layers 102 and second layers 103 are available. As shown in the top down view, via 144 may have a substantially circular cross section shape and a substantially cylindrical 3D shape. Via 144 may have any suitable diameter in the x-y plane such as a diameter in the range of to 300 nm, a diameter in the range of 10 to 100 nm, or a diameter in the range of about 5 to 50 nm. Other dimensions may be used. In some embodiments, via 144 has a diameter not less than 1.5 times the diameter of via 141.

Figure 1I:
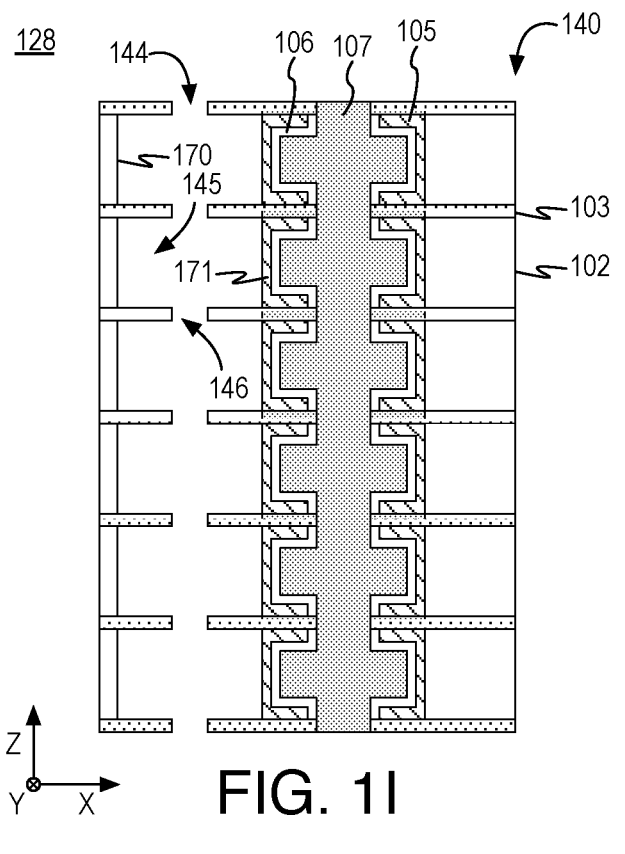

FIG. 1I illustrates a cross-sectional view of an example memory structure 128, which is similar to memory structure 127, after the selective etch of regions of first layers 102 to form expanded annular regions 145. Expanded annular regions 145 provide a greater void laterally from via 144 such that portions 146 of second layers 103 separate expanded annular regions 145. Expanded annular regions 145 may be formed using any suitable technique or techniques such as timed selective wet etch techniques that removes portions of first layers 102 without substantial removal of second layers 103. Expanded annular regions 145 may have any suitable diameters in the x-y plane and/or relative dimensions to those of via 144. In some embodiments, expanded annular regions 142 have a diameter in the range of 60 to 600 nm, a diameter in the range of 20 to 200 nm, or a diameter in the range of about 10 to 100 nm. Other dimensions may be used. Furthermore, the ratio of the diameter of expanded annular regions 142 to the diameter of via 141 may be, for example, about 4:1, about 3:1, or about 2:1. Other ratios greater than one may be used.

As shown, portions 146 of second layers 103 extend beyond newly formed sidewalls 170 of first layers 102 and sidewalls 171 of annular semiconductor structures. For example, portions 146 of second layers 103 extend toward an interior of via 144. The newly formed void defined by via 141 and expanded annular regions 142 define a generally cylindrical 3D shape that includes a vertically aligned and an alternating interleaved stack of cylinders having larger diameters (and larger heights) and of cylinders having smaller diameters (and smaller heights). The larger diameter and height cylinders will be used to form independent and separate capacitor plates portions while the smaller diameter and height cylinders will be used to interconnect the separate capacitor plates. It is noted that the formation of expanded annular regions 145 exposes sidewalls 171, which will provide for coupling between individual transistors and capacitors as discussed further herein below.

Figure 1J:
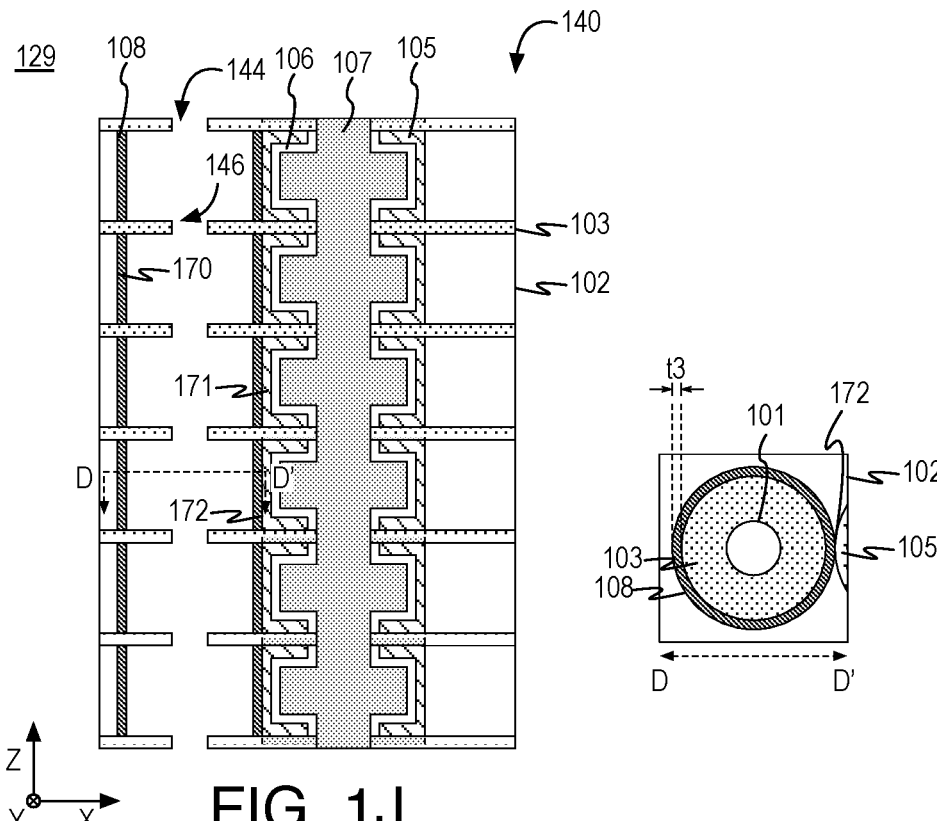

FIG. 1J illustrates a cross-sectional view and a second, vertically facing cross-sectional view of an example memory structure 129, which is similar to memory structure 128, after the selective formation of annular capacitor plates 108 on sidewalls 170, 171. In the context of FIG. 1J, annular capacitor plate structures are formed by selective deposition such that annular capacitor plate structures are formed on sidewalls 170, 171 without being formed on exposed portions 143 of second layers 103. Annular capacitor plates 108 may be formed using any suitable selective deposition technique or techniques such as atomic layer deposition (ALD) techniques or the like. As shown, annular capacitor plates 108 contact annular semiconductor structures 105 at interfaces 172 therebetween.

Annular capacitor plates 108 may include any suitable conductive material such as a metal. For example, annular capacitor plates 108 may include one or more of ruthenium, palladium, platinum, cobalt, nickel, zirconium, titanium, tantalum, aluminum, or alloys of these metals. In some embodiments, annular capacitor plates 108 have a lateral thickness t3 (i.e., in the x-y plane) in the range of 5 to 20 nm. In some embodiments, thickness t3 is in the range of 5 to nm. In some embodiments, thickness t3 is in the range of 8 to 40 nm. As shown in the vertically facing cross-sectional view D-D', annular semiconductor structures have a substantially annular shape with a circular outer edge and a circular inner edge. Also as shown, annular capacitor plates 108 are in direct contact with annular semiconductor structures 105. Such contact may be at or may be defined as a source or a drain of the transistor including one of annular semiconductor structures 105. As discussed further herein below, the other of the source or drain of the transistor including one of annular semiconductor structures 105 is in contact with an independent bit line.

Figure 1K:
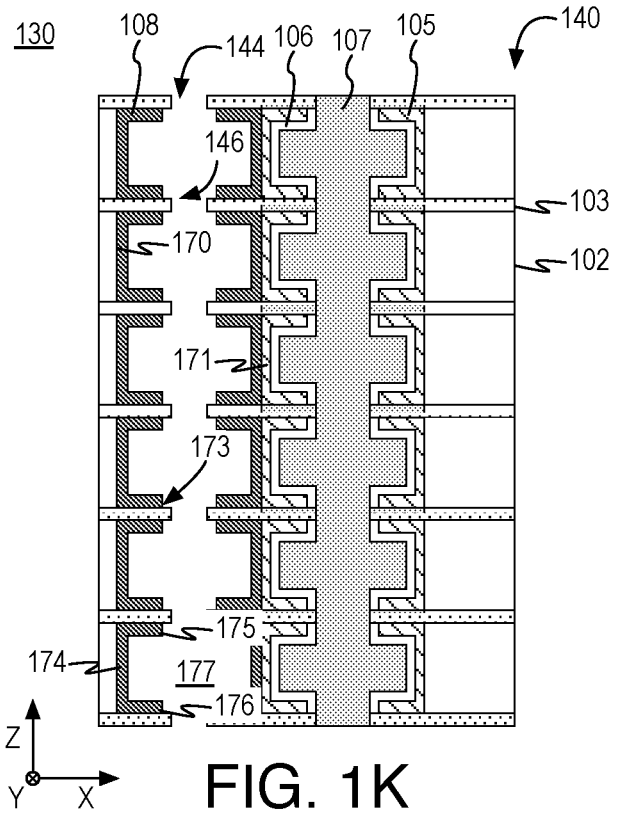

FIG. 1K illustrates a cross-sectional view of an example memory structure 130, which is similar to memory structure 128 of FIG. 1I, after the formation of annular capacitor plates 108 on sidewalls 170, 171 and on portions 173 of exposed lateral regions of second layers 103. In the context of FIG. 1K, annular capacitor plates 108 are formed by blanket deposition of conductive material followed by an anisotropic etch to remove unwanted portions of the blanket conductive material. For example, semiconductor material is removed from portions 146 of second layers 103 such that vertically aligned capacitors (discussed further below) are not shorted between their bottom plates. Memory structure 130 of FIG. 1K represents an alternative technique with respect to memory structure 129 of FIG. 1J. In the following, the example of memory structure 130 of FIG. 1K is used for the sake of clarity of presentation; however, example of memory structure 129 of FIG. 1J may also be used in subsequent operations.

Annular capacitor plates 108 of memory structure 130 may be formed using any suitable technique or techniques such as a blanket ALD operation followed by anisotropic selective etch, and annular capacitor plates 108 may include any suitable conductive material and dimensions discussed with respect to FIG. 1J. As shown, each annular capacitor plate 108 of FIG. 1E includes a first portion 174 forming an outer ring of the annular capacitor plate, and second and third portions 175, 176 extending from first portion 174 into an interior 177 of the annular capacitor plate. For example, at a cross section of the annulus, the capacitor plate has a substantially C shape or a substantially bracket shape.

Figure 1L:
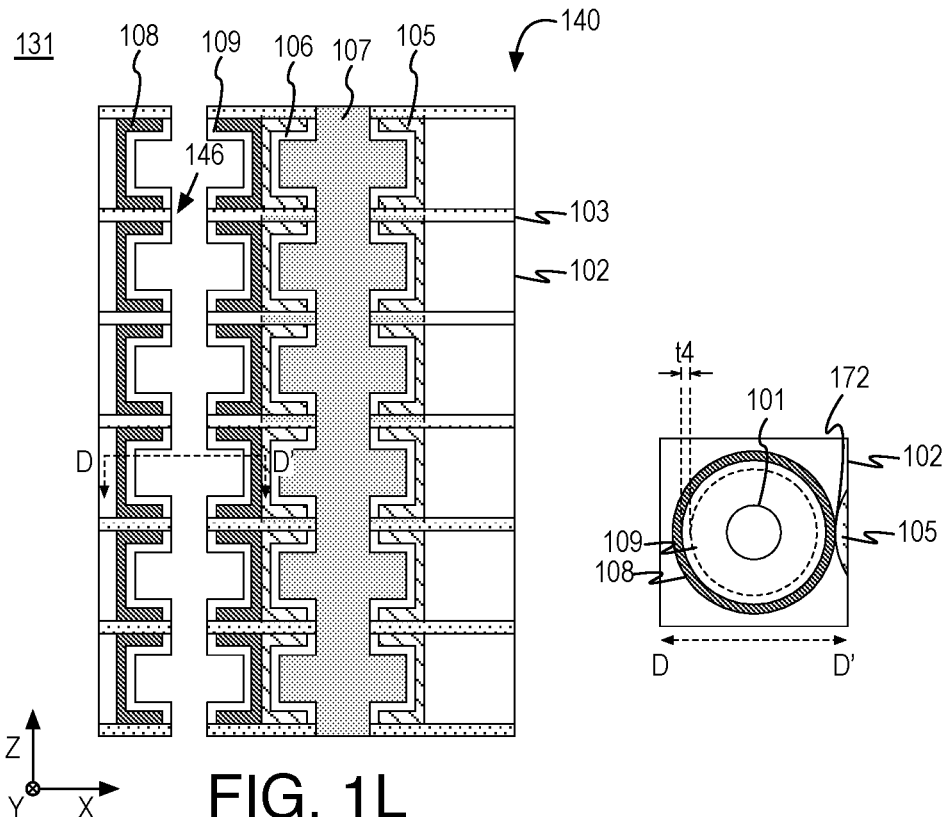

FIG. 1L illustrates a cross-sectional view and a second, vertically facing cross-sectional view of an example memory structure 131, which is similar to memory structure 130, after the formation of capacitor dielectric structures 109, which may also be characterized as annular capacitor dielectric structures 109. Capacitor dielectric structures 109 may be formed using any suitable technique or techniques such as blanket deposition of gate dielectric material followed by an anisotropic etch to remove unwanted portions of the blanket gate dielectric material. For example, capacitor dielectric material may be removed from portions 146 of second layers 103. However, since capacitor dielectric material bridging across portions 146 will not short vertically aligned capacitors, capacitor dielectric material may remain on portions 146.

Capacitor dielectric structures 109 may be formed using any suitable technique or techniques such as a blanket ALD operation followed by anisotropic selective etch to remove unwanted materials. The capacitor dielectric may include one layer or a stack of layers including one or more of titanium oxide (i.e., including titanium and oxygen), zirconium oxide (i.e., including zirconium and oxygen), aluminum oxide (i.e., including aluminum and oxygen), hafnium oxide (i.e., including hafnium and oxygen), silicon carbide (i.e., including silicon and carbon), gallium nitride (i.e., including gallium and nitrogen), silicon oxide (i.e., including silicon and oxygen), strontium titanium oxide (i.e., including strontium, titanium, and oxygen), barium titanium oxide (i.e., including barium, titanium, and oxygen), barium strontium titanium oxide (i.e., including barium, strontium, titanium, and oxygen), tantalum oxide (i.e., including tantalum and oxygen), or the like. Capacitor dielectric structures 109 may have any suitable dimensions. In some embodiments, capacitor dielectric structures 109 have a thickness t4 in the range of 0.5 to 20 nm. In some embodiments, thickness t4 is in the range of 0.5 to 10 nm. In some embodiments, thickness t4 is in the range of 8 to 20 nm. Other thicknesses may be used.

Figure 1M:
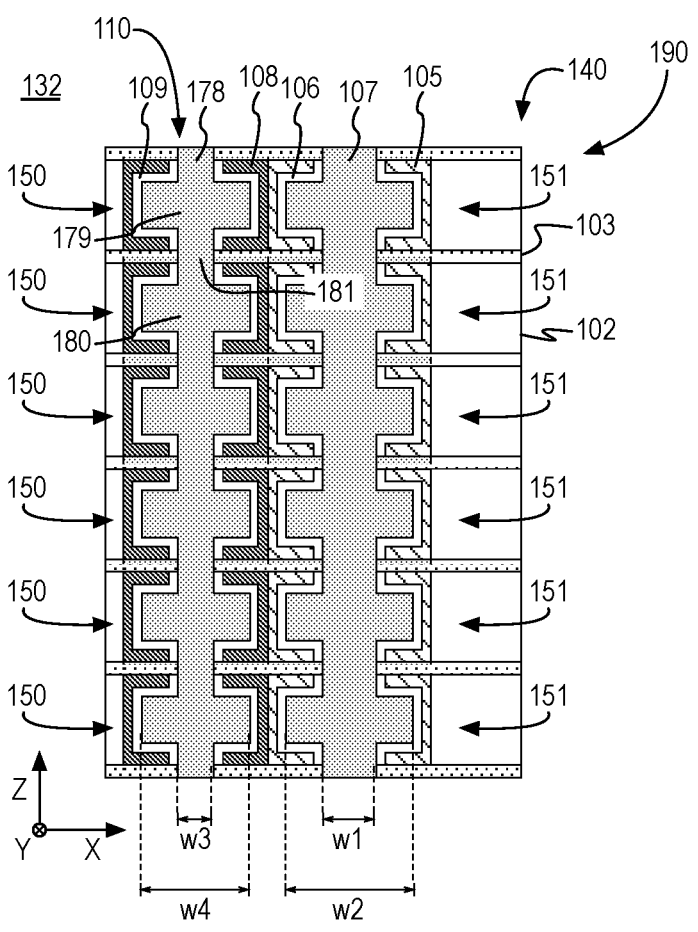

FIG. 1M illustrates a cross-sectional view of an example memory structure 132, which is similar to memory structure 131, after the formation of a capacitor plate metal 178 within the remaining voids of via 144 to provide a shared capacitor plate 110. Capacitor plate 110 may be coupled to a shared ground, for example, to couple any number of vertically aligned capacitors to the ground. Therefore, capacitor plate 110 may be characterized as a capacitor plate, a top capacitor plate, a ground plate, or the like. Capacitor plate metal 178 may be formed using any suitable technique or techniques such as fill deposition techniques followed by planarization techniques.

Capacitor plate metal 178 may include any suitable capacitor plate material. For example, capacitor plate metal 178 may include one or more of ruthenium, palladium, platinum, cobalt, nickel, zirconium, titanium, tantalum, aluminum, or alloys of these metals. As shown, shared capacitor plate 110 extends vertically through each of annular capacitor plates 108, and shared capacitor plate 110 is separated from each of annular capacitor plates 108 by capacitor dielectric structures 109. Capacitor plate 110 includes a first portion 179 adjacent a first of annular capacitor plates 108, a second portion 180 adjacent a second of annular capacitor plates 108, and a third portion 181 between first portion 179 and second portion 180 such that third portion 181 has a lateral width w3 (or diameter) less than a lateral width w4 (or diameter) of first portion 179 and less than a lateral width w4 (or diameter) of second portion 180. Furthermore, in some embodiments, lateral width w1 is greater than lateral width w3 and/or lateral width w2 is greater than lateral width w4.

Figure 1N:
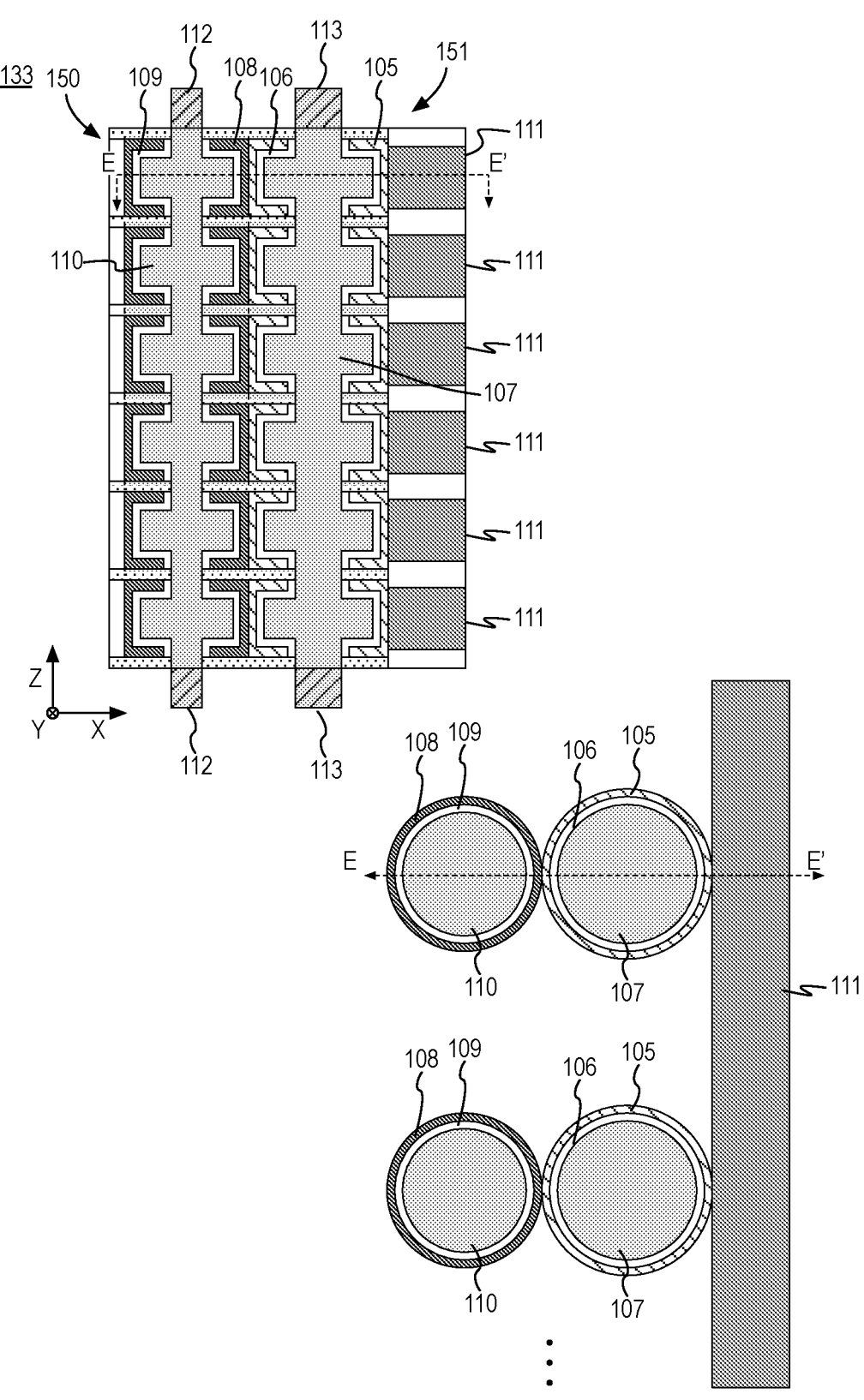

Thereby a memory device 190 is formed inclusive of a number of vertically aligned transistors 151, each of transistors 151 including one of annular semiconductor structures 105 coupled to an independent bit line (shown in FIG. 1N). Transistors 151 further include comprising shared word line 107 extending vertically through each of annular semiconductor structures 105. Memory device 190 further includes a corresponding number of vertically aligned capacitors 150, each of capacitors 150 including one of annular capacitor plates 108 surrounding one of capacitor dielectric structures 109 such that each of annular capacitor plates 108 are in contact with one of annular semiconductor structures 105. Capacitors 150 further include shared capacitor plate 110 extending vertically through each of annular capacitor dielectric structures 109 and surrounding annular capacitor plates 108.

FIG. 1N illustrates a cross-sectional view and a second, vertically facing cross-sectional view of an example memory structure 133, which is similar to memory structure 132, after the formation of independent bit lines 111. Bit lines 111 may be formed using any suitable technique or techniques such as damascene techniques, subtractive metallization patterning techniques, or the like. Bit lines 111 may include any suitable conductive materials such as copper, tungsten, aluminum, etc. As shown with respect to cross-section E-E', bit lines 111 extend into and out of the page (i.e., along the y-dimension) and can couple any number of stacks transistors 151 coupled to corresponding stacks of capacitors 150. Also as shown in FIG. 1N, optional contacts 112, 113 may be made to capacitor plate 110 and word line 107, respectively.

Figure 2:
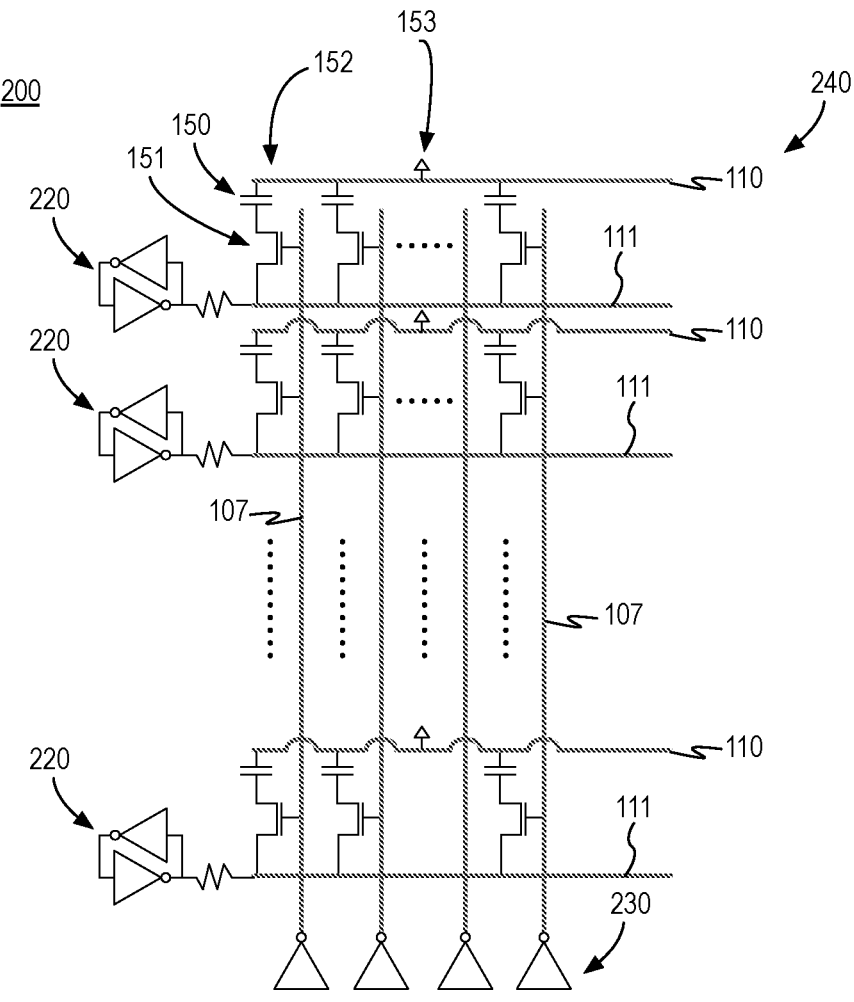
FIG. 2 illustrates a circuit diagram of an example one transistor-one capacitor dynamic random access memory device inclusive of a one transistor-one capacitor array.

FIG. 2 illustrates a circuit diagram of an example one transistor-one capacitor dynamic random access memory device 200 inclusive of a one transistor-one capacitor array 240, arranged in accordance with at least some implementations of the present disclosure. As shown in FIG. 2, 1T-1C DRAM device 200 includes sense amplifiers 220 and word line drivers 230, which provide peripheral control circuitry for 1T-1C DRAM device 200. 1T-1C DRAM device 200 may include other peripheral circuitry as known in the art.

1T-1C DRAM device 200 further includes 1T-1C array 240 including any number of 1T-1C cells 152 such that each of 1T-1C cells 152 includes a transistor 151 and a capacitor 150. Furthermore, each of 1T-1C cells 152 is accessed by a bit line 111 and a word line 107. Using bit lines 111 and word lines 107, each of 1T-1C cells 152 may be accessed for read/write. For example, each bit line 111 accesses a row of 1T-1C cells 152 and each word line 107 accesses a column of 1T-1C cells 152 such that each of 1T-1C cells 152 may be addressed by row and column.

Each of 1T-1C cells 152 includes one of transistors 151 and a corresponding one of capacitors 150 (i.e., the transistor and capacitor are in direct contact as discussed). For example, a source or drain of transistor 151 is coupled to one of bit lines 111 and the other of the source and drain is coupled to a capacitor 150, which is turn coupled to capacitor plate 110, which leads to a ground 153. Also as shown, the gate of a transistor 151 is coupled to and controllable by one of word lines 107. In practice, when a word line 107 is ON, each corresponding transistor 151 coupled to the word line is ON and data may be written to capacitor 150 using a signal on the corresponding bit line 111. Looking at it another way, when a data signal is provided on one of bit lines, the data (i.e., a bit) is only written to a capacitor 150 when the corresponding word line 107 is ON. With reference to FIG. 1N, bit lines 111 run in the y-dimension, word lines 107 run in the z-dimension, and capacitor plates 110 also run in the z-dimension.

Figure 3:
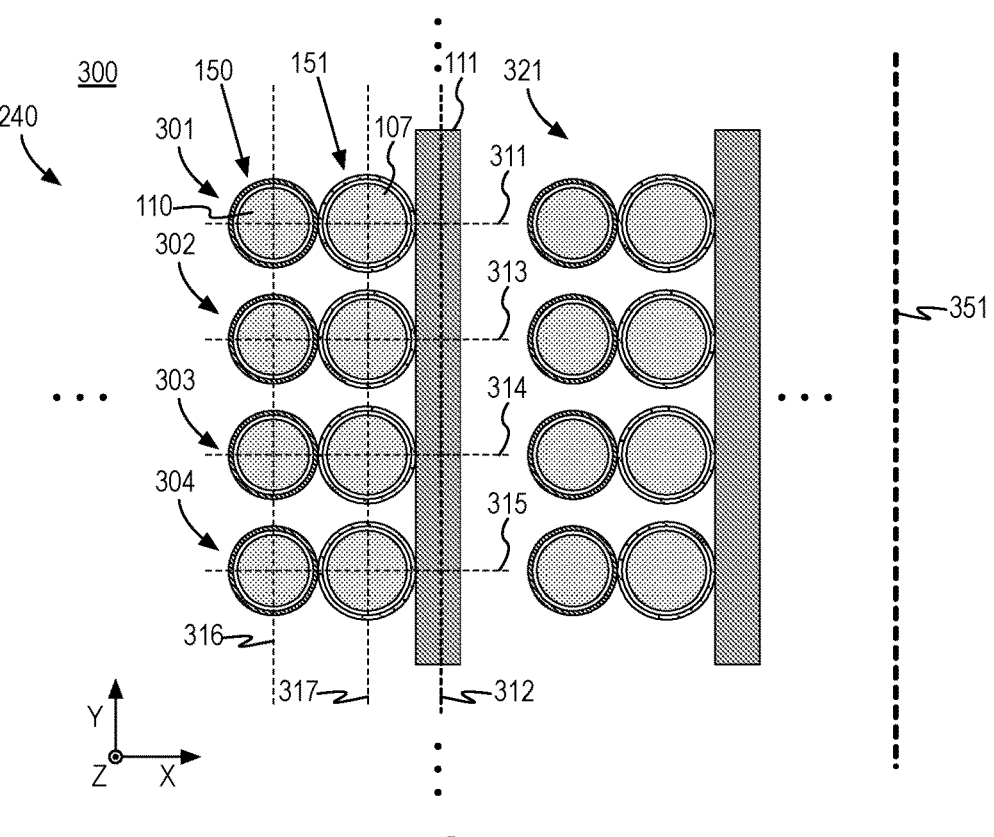
FIG. 3 illustrates an example orthogonal layout of a one transistor-one capacitor array.

FIG. 3 illustrates an example orthogonal layout 300 of one transistor-one capacitor array 240, arranged in accordance with at least some implementations of the present disclosure. As shown in FIG. 3, a number of first vertically aligned 1T-1C cells 301, which include vertically aligned capacitors 150 and vertically aligned transistors 151, as discussed above, are aligned orthogonal to shared bit lines 111 such that a line 311 extending laterally through a center of both shared capacitor plate 110 and shared word line 107, is orthogonal to a line 312 running along a length of bit lines 111. As used herein, running along a length indicates a line along a length of a line that is greater than its depth and greater than its width. That is, a line may be defined by a length of a bit line or other feature such that the length is greater than the depth or width of the line or feature. Furthermore, with respect to bit lines 111 running along the length indicates the direction along which multiple 1T-1C cells 301 are connected.

Similarly, another set of vertically aligned 1T-1C cells 302, which include analogous vertically aligned capacitors and transistors, are aligned orthogonal to shared bit lines 111 such that a line 313 extending laterally through a center of both the shared capacitor plate and shared word line of 1T-1C cells 302, is orthogonal to line 312. In the same manner, a line 314 extending laterally through a center of both the shared capacitor plate and shared word line of 1T-1C cells 303, is orthogonal to line 312 and a line 315 extending laterally through a center of both the shared capacitor plate and shared word line of 1T-1C cells 304, is also orthogonal to line 312. Furthermore, a line 316 extending laterally through centers of capacitor plates across ones of 1T-1C cells 301, 302, 303, 304 is parallel to line 312 and orthogonal to lines 311, 313, 314, 315, and a line 317 extending laterally through centers of word lines across ones of 1T-1C cells 301, 302, 303, 304 is parallel to line 312 and orthogonal to lines 311, 313, 314, 315. Lines 311, 312, 313, 314, 315, 316, 317 may be characterized as centerlines as the extend through centers of shared capacitor plates and shared word lines.

In orthogonal layout 300, a Manhattan type layout is established that may extend in a repeating pattern in the x-y plane as shown with respect to a second superset 321 of sets 1T-1C cells. Furthermore, in some embodiments, line 312 is substantially parallel to an IC die edge 351. Such layouts may provide for ease of implementation and other advantages.

Figure 4:
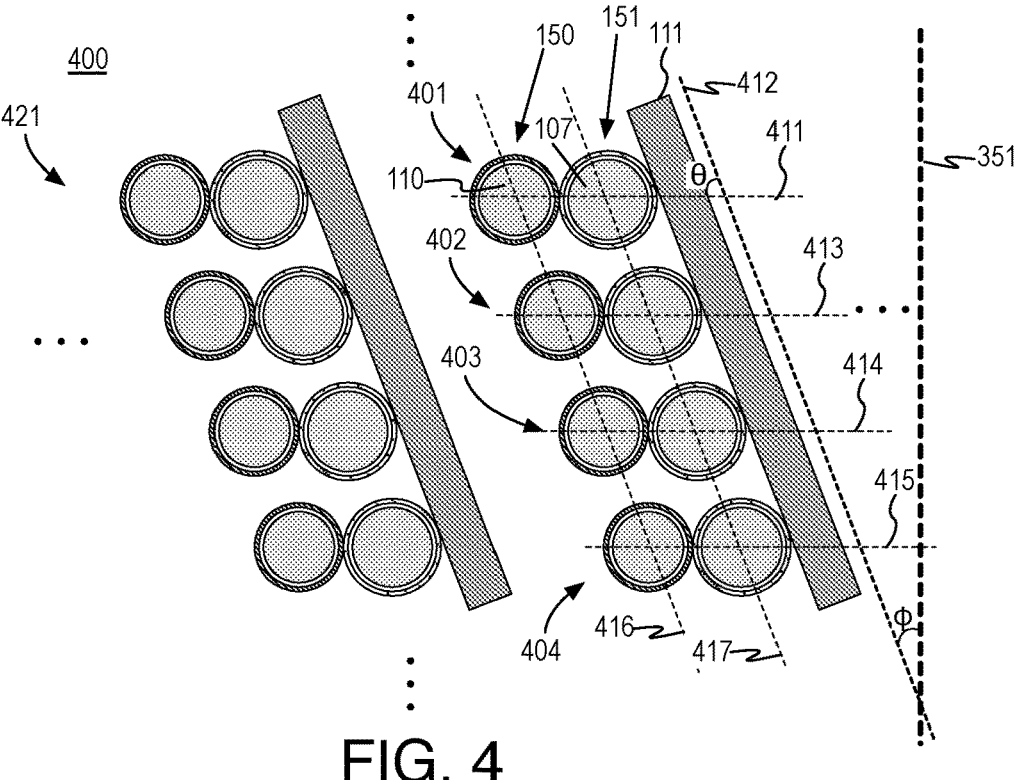
FIG. 4 illustrates an example hexagonal close packed layout of a one transistor-one capacitor array.

FIG. 4 illustrates an example hexagonal close packed layout 400 of one transistor-one capacitor array 240, arranged in accordance with at least some implementations of the present disclosure. As shown in FIG. 4, a number of first vertically aligned 1T-1C cells 401, which include vertically aligned capacitors 150 and vertically aligned transistors 151, as discussed herein, are angled with respect to shared bit lines 111 such that a line 411 extending laterally through a center of both shared capacitor plate 110 and shared word line 107, is orthogonal to a line 412 (in FIG. 4, line 412 is moved away from the centerline of shared bit lines 111 for the sake of clarity of presentation) running along a length of bit lines 111 is at an angle of $\theta$. Angle $\theta$ may be any suitable angle that increases packing density of 1T-1C array 240. In some embodiments, angle $\theta$ is at 60°. In some embodiments, angle $\theta$ is in the range of 50° to 70°. In some embodiments, angle $\theta$ is in the range of 55° to 65°.

Similarly, another set of vertically aligned 1T-1C cells 402, which include analogous vertically aligned capacitors and transistors, are at an angle with respect to shared bit lines 111 such that a line 413 extending laterally through a center of both the shared capacitor plate and shared word line of 1T-1C cells 402, is at angle $\theta$ with respect to line 412. In the same manner, a line 414 extending laterally through a center of both the shared capacitor plate and shared word line of 1T-1C cells 403, is at angle $\theta$ with respect to line 412 and a line 415 extending laterally through a center of both the shared capacitor plate and shared word line of 1T-1C cells 404, is also a angle $\theta$ with respect to line 412. Furthermore, a line 416 extending laterally through centers of capacitor plates across ones of 1T-1C cells 401, 402, 403, 404 is parallel to line 412 and at angle $\theta$ with respect to lines 411, 413, 414, 415, and a line 417 extending laterally through centers of word lines across ones of 1T-1C cells 401, 402, 403, 404 is parallel to line 412 and at angle $\theta$ with respect to lines 411, 413, 414, 415. Lines 411, 412, 413, 414, 415, 416, 417 may be characterized as centerlines as the extend through centers of shared capacitor plates and shared word lines.

In layout 400, a hexagonal close packed (HCP) type layout is established that may extend in a repeating pattern in the x-y plane as shown with respect to a second superset 421 of sets of 1T-1C cells. Furthermore, in some embodiments, line 412 is at an angle $\varphi$ with respect to IC die edge 351. Angle $\varphi$ may be any suitable angle that increases packing density of 1T-1C array 240 and may be established based on angle $\theta$. In some embodiments, angle $\varphi$ is 30°. In some embodiments, angle $\varphi$ is in the range of 40° to 50°. In some embodiments, angle $\varphi$ is in the range of 35° to 45°. Such HCP layouts may provide for maximum packing density and other advantages.

The 1T-1C DRAM devices discussed herein may be fabricated in front end of line (FEOL) or back end of line (BEOL). Furthermore, such 1T-1C DRAM devices may be implemented in low temperature contexts. Discussion now turns to such implementations.

Figure 5:
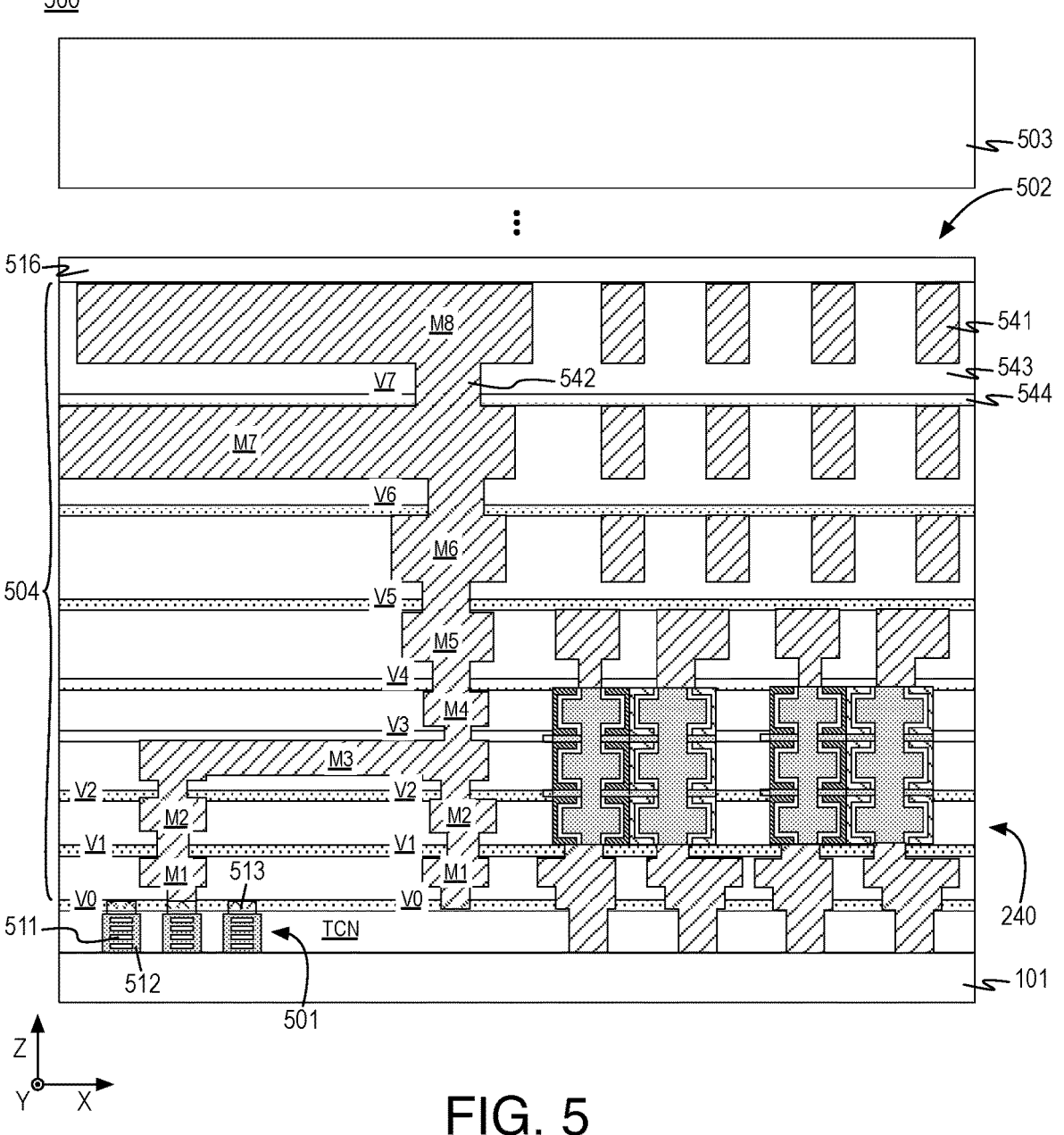
FIG. 5 illustrates a cross-sectional view of a one transistor-one capacitor dynamic random access memory device.

FIG. 5 illustrates a cross-sectional view of a one transistor-one capacitor dynamic random access memory device 500, arranged in accordance with at least some implementations of the present disclosure. For example, 1T-1C DRAM device 500 implements 1T-1C array 240, having any characteristics discussed herein, in BEOL with control transistors 501 in FEOL. In FIG. 5, an orthogonal to gate view is provided such that orthogonal to the gate refers to the gate of control transistors 501. 1T-1C DRAM device 500 may be formed on substrate 101 such that substrate 101 is used as a base for manufacture of control transistors 501, 1T-1C array 240, and other components of 1T-1C DRAM device 500.

1T-1C DRAM device 500 includes an IC die 502, which is a monolithic integrated circuit including control transistors 501, 1T-1C array 240, and front-side metallization layers 504 (or front-side interconnect layers). IC die 502 may also include optional back-side metallization layers in the negative z-direction (not shown). In some embodiments, such back-side metallization layers are formed by removal of substrate 101 as is known in the art. 1T-1C DRAM device 500 further includes a package level cooling structure 503, which may be deployed on or over front-side metallization layers 504 (as shown) or on or over a back-side of IC die 502. In some embodiments, package level cooling structure 503 is coupled to IC die 502 by an adhesion layer 516. Adhesion layer 516 may be formed on the front-side of IC die 502 (as shown) or on or over a back-side of IC die 502. In some embodiments, package level cooling structure 503 is provided proximal to, but not necessarily directly on, IC die 502. For example, IC die 502 may be deployed as part of a multi-chip stack or multi-chip package and package level cooling structure 503 may be provided on or over another die in the stack.

Control transistors 501 provide control circuitry for 1T-1C array 240, and control transistors 501 each include one or more channel structures 511 (or channel regions), gate structures 512, and gate contacts 513. Each of control transistors 501 also include source and drain structures, and source and drain contacts, which are not shown in the cross-section of FIG. 1n the example of FIG. 5, nanosheet transistors are illustrated. However, control transistors 501 may deploy any of planar FETs, Fin FETs, GAA FETs (inclusive of nanowire FETs and nanosheet FETs), RCATs, or other architectures.

Interconnectivity, signal routing, power delivery, and routing to an outside device (not shown) are provided by front-side metallization layers 504 (and optional back-side metallization layers, if used). As used herein, the term metallization layer indicates metal interconnections or wires that provide electrical routing. Adjacent metallization layers, such as metallization interconnects 541, are interconnected by vias, such as vias 542, that may be characterized as part of the metallization layers or between the metallization layers. As used herein, the term front- and back-side are used in their ordinary meaning in the art based on the buildup direction of IC die 502 with the front-side being the side exposed during processing. The back-side is then the opposite side, which may be exposed during processing by attaching the front-side to a carrier wafer and exposing the back-side (e.g., by back-side grind or etch operations) as known in the art.

In the illustrated example, front-side metallization layers 504 include V0, M1, V1, M2, V2, M3, V3, M4, V4, M5, V6, M7, V7, and M8. However, front-side metallization layers 504 may include any number of metallization layers. Front-side metallization layers 504 are embedded within dielectric materials 543, 544. As shown, 1T-1C array 240 are implemented within front-side metallization layers 504. As discussed, 1T-1C DRAM device 500 includes IC die 502 and an active cooling structure operable to remove heat from IC die 502 to achieve a very low operating temperature of IC die 502. The active cooling structure may be any cooling structure discussed herein below.

Figure 6:
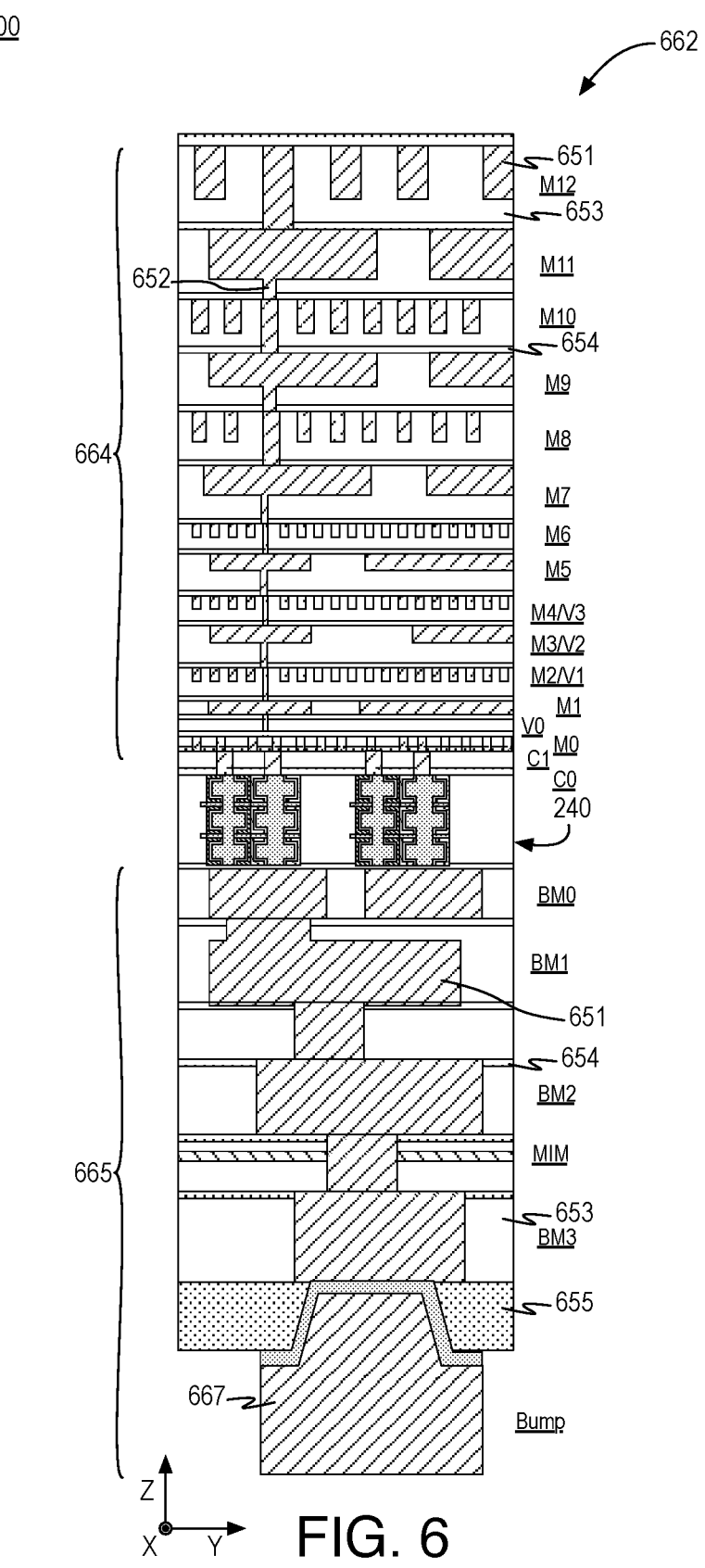
FIG. 6 illustrates a cross-sectional view of an example integrated circuit die including a one transistor-one capacitor dynamic random access memory array in a front end of line.

FIG. 6 illustrates a cross-sectional view of an example integrated circuit die including a one transistor-one capacitor dynamic random access memory array in a front end of line, arranged in accordance with at least some implementations of the present disclosure. As shown, a 1T-1C DRAM system 600 includes 1T-1C array 240 in accordance with any 1T-1C array and having any characteristics discussed herein. As shown, 1T-1C DRAM system 600 includes front-side metallization layers 664 (or front-side interconnect layers) and optional back-side metallization layers 665 (or back-side interconnect layers) to form an integrated circuit (IC) die 662. Front-side metallization layers 664 may be formed using any suitable technique or techniques such as dual damascene techniques, single damascene techniques, subtractive metallization patterning techniques, or the like.

Similarly, back-side metallization layers 665 may be formed using any suitable technique or techniques. In some embodiments, after front-side processing, the front-side of the wafer is attached to a carrier substrate and back-side removal processing (e.g., back-side grind or etch) is used to thin the wafer. Back-side metallization layers 665 are then formed using dual damascene, single damascene, subtractive metallization patterning, etc. 1T-1C array 240 may from the front-side and may be coupled to off-die control circuitry, for example.

For example, interconnectivity, signal routing, and power delivery to 1T-1C array 240 is provided by front-side metallization layers 664, optional back-side metallization layers 665, and package level interconnects 667. In the illustrated example, package level interconnects 667 are provided on or over a back-side of IC die 662 as bumps over a passivation layer 655. However, package level interconnects 667 may be provided using any suitable interconnect structures such as bond pads, solder bumps, etc. Furthermore, in some embodiments, package level interconnects 667 are provided on or over a front-side of IC die 662 (i.e., over front-side metallization layers 664) and a package level cooling structure is provided on or over a back-side of IC die. Adjacent metallization layers, such as metallization interconnects 651, are interconnected by vias, such as vias 652, that may be characterized as part of the metallization layers or between the metallization layers. In the illustrated example, front-side metallization layers 664 include M0, V0, M1, M2/V1, M3/V2, M4/V3, and M4-M12. However, front-side metallization layers 664 may include any number of metallization layers such as eight or more metallization layers. Similarly, back-side metallization layers 665 include BM0, BM1, BM2, and BM3. However, back-side metallization layers 665 may include any number of metallization layers such as two to five metallization layers. Front-side metallization layers 664 and back-side metallization layers 665 are embedded within dielectric materials 653, 654.

As discussed the circuits and systems of the present embodiments may advantageously be deployed at very low temperatures (i.e., at or below 0° C.). Discussion now turns to exemplary very low temperature systems.

Figure 7:
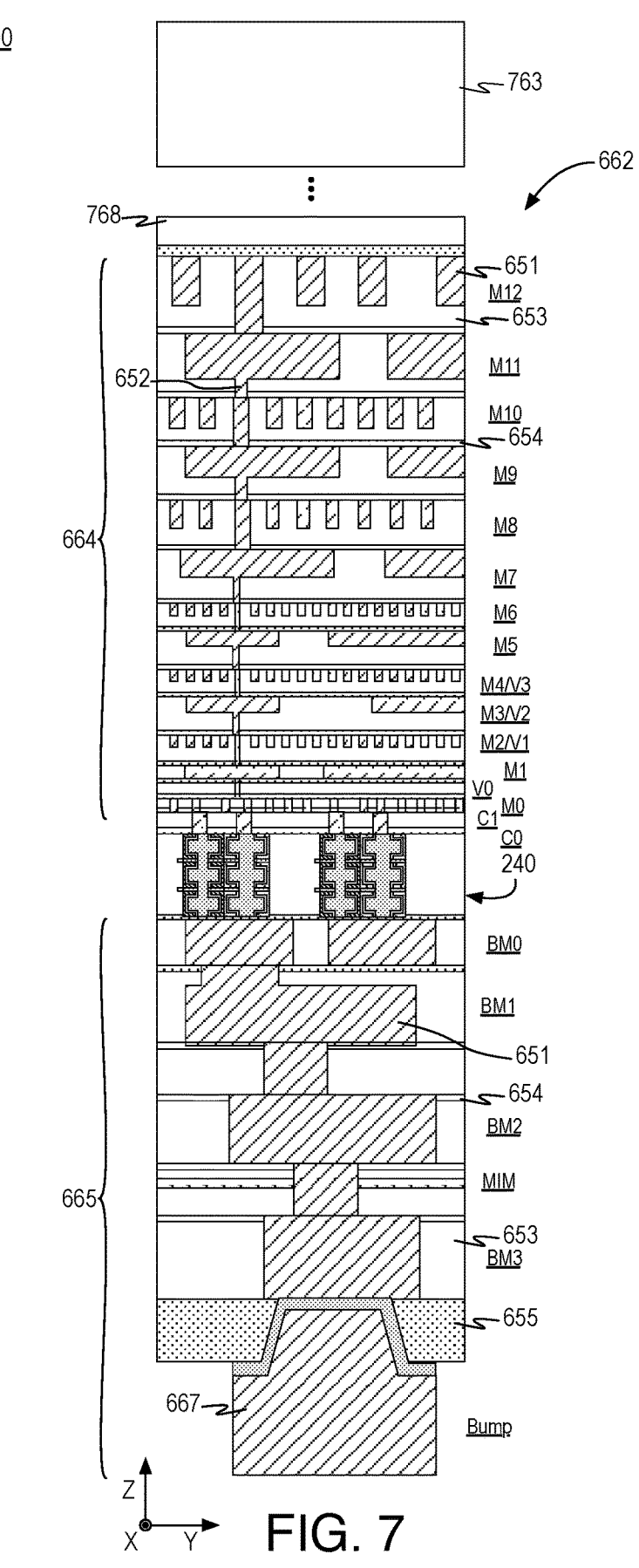
FIG. 7 illustrates a cross-sectional view of a one transistor-one capacitor dynamic random access memory integrated circuit system for implementation at very low temperature.

FIG. 7 illustrates a cross-sectional view of a one transistor-one capacitor dynamic random access memory integrated circuit system 700 for implementation at very low temperature, arranged in accordance with at least some implementations of the present disclosure. As shown, IC system 700 includes IC die 662, which is a monolithic integrated circuit. IC system 700 further includes a package level cooling structure 763, which may be deployed on or over front-side metallization layers 664 (as shown) or on or over a back-side of IC die 662. In some embodiments, package level cooling structure 763 is coupled to IC die 662 by an adhesion layer 768. Notably, IC system 700 may be deployed without back-side metallization layers 665.

IC system 700 includes IC die 662 and an active cooling structure operable to remove heat from IC die 662 to achieve a very low operating temperature of IC die 662. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active cooling structure may be provided as a package level structure (i.e., separable from IC die 662) as shown with respect to package level cooling structure 763, as a die level structure (i.e., integral to IC die 662), or both. In some embodiments, an active cooling structure is not needed as IC die 662 is deployed in a sufficiently cold environment.

Figure 8:
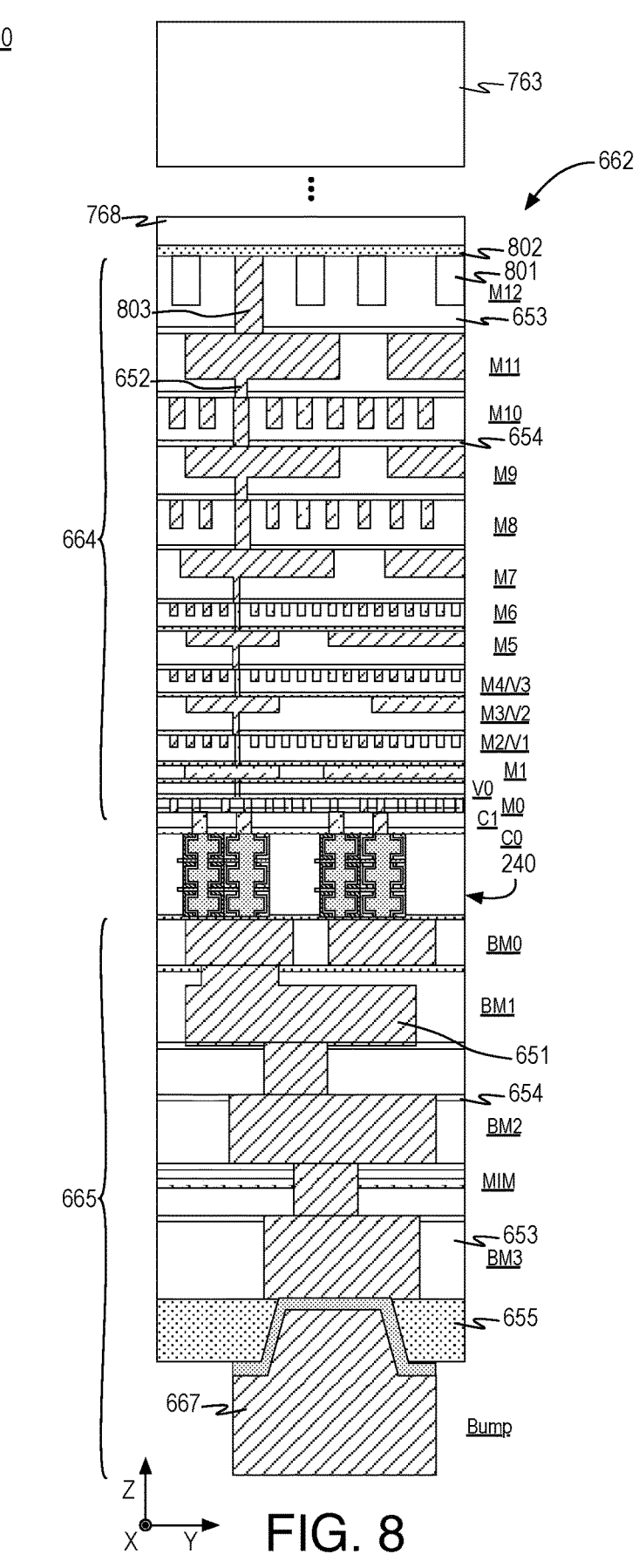
FIG. 8 illustrates a cross-sectional view of a low temperature one transistor-one capacitor dynamic random access memory integrated circuit system using die level cooling.

FIG. 8 illustrates a cross-sectional view of a low temperature one transistor-one capacitor dynamic random access memory integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 662 includes active cooling structures or components to remove heat from IC die 662 to achieve an operating temperature of IC die 662 at or below a target temperature such as 0° C. or any other operating or target temperature discussed herein.

In IC system 800, IC die 662 includes die level active cooling as provided by microchannels 801. Microchannels 801 are to convey a heat transfer fluid therein to remove heat from IC die 662. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane. The term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M12. In other embodiments, microchannels 801 are implemented over metallization level M12. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 662 and over a number of front-side metallization layers 664. As discussed, microchannels 801 are to convey a heat transfer fluid therein. In some embodiments, a metallization feature 803 of metallization layer M12 is laterally adjacent to microchannels 801. For example, metallization feature 803 may couple to a package level interconnect structure (not shown) for signal routing for IC die 662. In the example of IC system 800, package level cooling structure 763 may be a passive heat removal device such as a heat sink or the like. In some embodiments, package level cooling structure 763 is not deployed in IC system 800.

Figure 9:
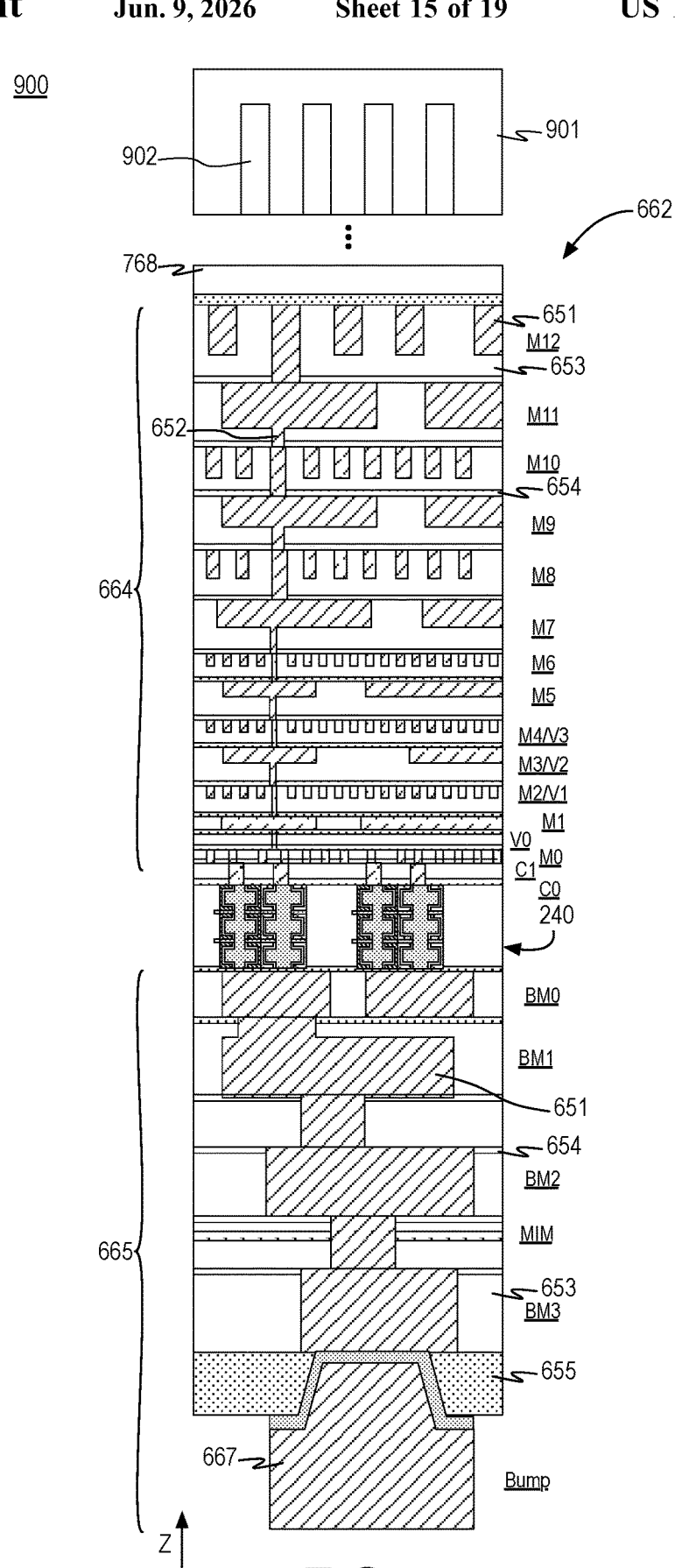
FIG. 9 illustrates a cross-sectional view of a low temperature one transistor-one capacitor dynamic random access memory integrated circuit system using package level cooling.

FIG. 9 illustrates a cross-sectional view of a low temperature one transistor-one capacitor dynamic random access memory integrated circuit system 900 using package level cooling, arranged in accordance with at least some implementations of the present disclosure. In the example of IC system 900, IC die 662 includes active cooling structures or components to remove heat from IC die 662 to achieve an operating temperature of IC die 662 at or below a target temperature such as 0° C. or any other operating or target temperature discussed herein.

In IC system 900, package level cooling structure 763 includes an active cooling structure 901 having microchannels 902. Microchannels 902 are to convey a heat transfer fluid therein to remove heat from IC die 662. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to IC die 662 such that the chiller has a solid body having microchannels therein to convey a heat transfer fluid.

FIG. 10 illustrates a cross-sectional view of a low temperature one transistor-one capacitor dynamic random access memory integrated circuit system 1000 using die level and package level cooling, arranged in accordance with at least some implementations of the present disclosure. In the example of IC system 1000, IC die 662 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed by microchannels 801 and active cooling structure 901 may be the same or they may be different. Such embodiments may advantageously provide improved flexibility.

Figure 11:
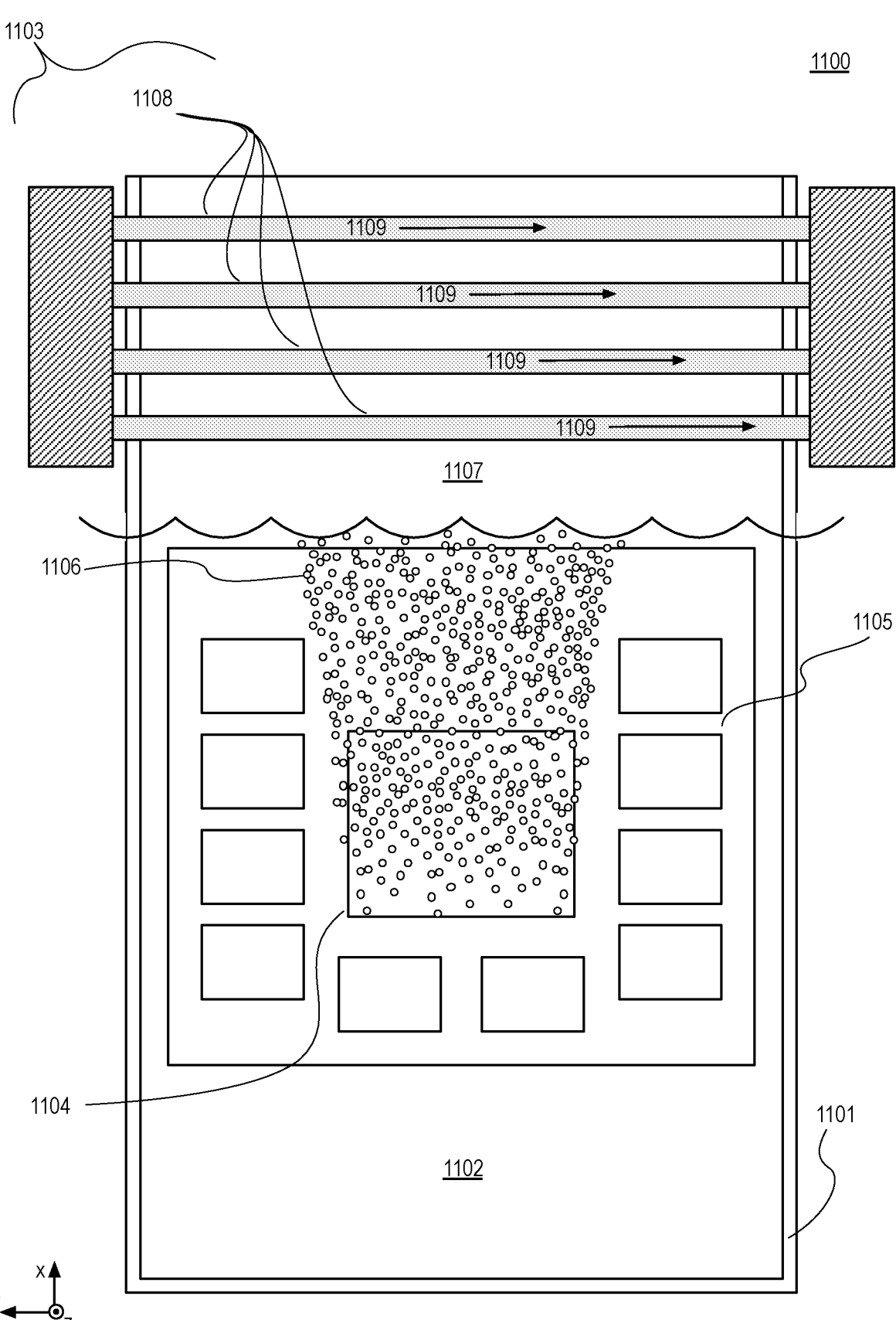
FIG. 11 illustrates a view of an example two-phase immersion cooling 1100 for low temperature operation of an integrated circuit die having one transistor-one capacitor dynamic random access memory.

FIG. 11 illustrates a view of an example two-phase immersion cooling system 1100 for low temperature operation of an integrated circuit die having one transistor-one capacitor dynamic random access memory, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any IC device as discussed herein is immersed in low-boiling point liquid 1102. In some embodiments, the IC device or system as deployed in two-phase immersion cooling system 1100 does not include additional active cooling structures, although such die level or package level active cooling structures may be used in concert with two-phase immersion cooling system 1100. In some embodiments, when deployed in two-phase immersion cooling system 1100, package level cooling structure 763 is a heat sink, a heat dissipation plate, a porous heat dissipation plate or the like.

Notably, IC die 662, deploying one or more functional circuit blocks having one transistor-one capacitor dynamic random access memory is the source of heat in the context of two-phase immersion cooling system 1100. For example, IC die 662 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 763 includes a passive cooling structure such as a heat sink for immersion in low-boiling point liquid 1102.

Figure 12:
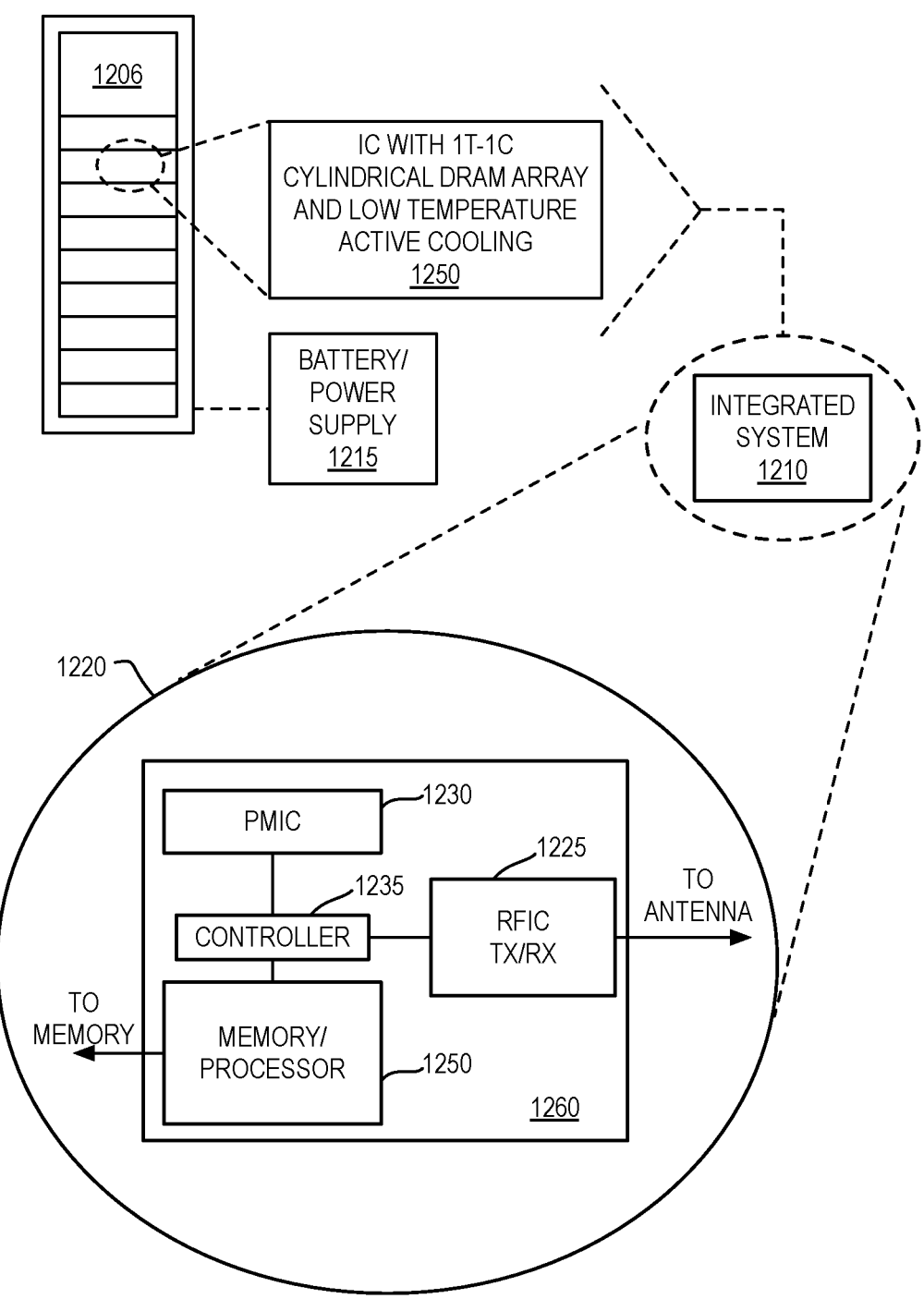
FIG. 12 illustrates diagram of an example data server machine employing a low temperature one transistor-one capacitor dynamic random access memory integrated circuit system.

FIG. 12 illustrates diagram of an example data server machine 1206 employing a low temperature one transistor-one capacitor dynamic random access memory integrated circuit system, arranged in accordance with at least some implementations of the present disclosure. Server machine 1206 may be any commercial server, for example, including any number of high-performance computing platforms disposed within a rack and networked together for electronic data processing, which in the exemplary embodiment includes one or more devices 1250 having an IC with 1T-1C DRAM and optional low temperature active cooling operable to remove heat from the integrated circuit to achieve any low operating temperature discussed herein.

Also as shown, server machine 1206 includes a battery and/or power supply 1215 to provide power to devices 1250, and to provide, in some embodiments power delivery functions such as power regulation. Devices 1250 may be deployed as part of a package-level integrated system 1210. Integrated system 1210 is further illustrated in the expanded view 1220. In the exemplary embodiment, devices 1250 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1250 is a microprocessor including an SRAM cache memory. As shown, device 1250 may employ a die or device having any memory structures and/or related characteristics discussed herein. Device 1250 may be further coupled to (e.g., communicatively coupled to) a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller 1235 thereof.

Figure 13:
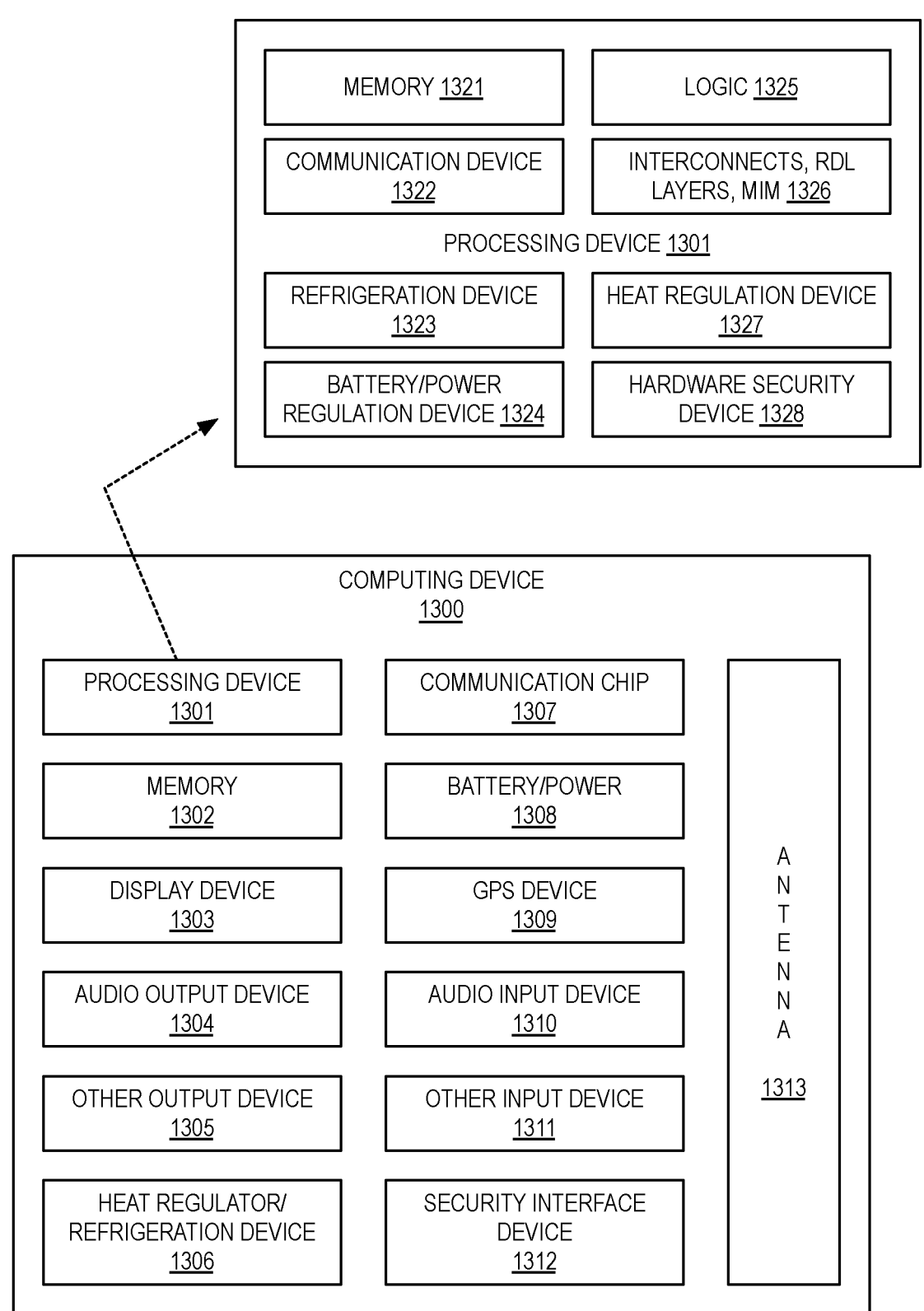
FIG. 13 is a block diagram of an example computing device, all arranged in accordance with at least some implementations of the present disclosure.

FIG. 13 is a block diagram of an example computing device 1300, arranged in accordance with at least some implementations of the present disclosure. For example, one or more components of computing device 1300 may include any of the devices or structures discussed herein. A number of components are illustrated in FIG. 13 as being included in computing device 1300, but any one or more of these components may be omitted or duplicated, as suitable for the application. In some embodiments, some or all of the components included in computing device 1300 may be attached to one or more printed circuit boards (e.g., a motherboard). In some embodiments, various ones of these components may be fabricated onto a single system-on-a-chip (SoC) die. Additionally, in various embodiments, computing device 1300 may not include one or more of the components illustrated in FIG. 13, but computing device 1300 may include interface circuitry for coupling to the one or more components. For example, computing device 1300 may not include a display device 1303, but may include display device interface circuitry (e.g., a connector and driver circuitry) to which display device 1303 may be coupled. In another set of examples, computing device 1300 may not include an audio output device 1304, other output device 1305, global positioning system (GPS) device 1309, audio input device 1310, or audio input device 1311, but may include audio output device interface circuitry, other output device interface circuitry, GPS device interface circuitry, audio input device interface circuitry, audio input device interface circuitry, to which audio output device 1304, other output device 1305, GPS device 1309, audio input device 1310, or audio input device 1311 may be coupled.

Computing device 1300 may include a processing device 1301 (e.g., one or more processing devices). As used herein, the term processing device or processor indicates a device that processes electronic data from registers and/or memory to transform that electronic data into other electronic data that may be stored in registers and/or memory. Processing device 1301 may include a memory 1321, a communication device 1322, a refrigeration device 1323, a battery/power regulation device 1324, logic 1325, interconnects 1326 (i.e., optionally including redistribution layers (RDL) or metal-insulator-metal (MIM) devices), a heat regulation device 1327, and a hardware security device 1328.

Processing device 1301 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1300 may include a memory 1302, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1302 includes memory that shares a die with processing device 1301. This memory may be used as cache memory and may include embedded dynamic random-access memory (eDRAM) or spin transfer torque magnetic random-access memory (STT-M RAM).

Computing device 1300 may include a heat regulation/refrigeration device 1306. Heat regulation/refrigeration device 1306 may maintain processing device 1301 (and/or other components of computing device 1300) at a predetermined low temperature during operation. This predetermined low temperature may be any temperature discussed herein.

In some embodiments, computing device 1300 may include a communication chip 1307 (e.g., one or more communication chips). For example, the communication chip 1307 may be configured for managing wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1307 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1307 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1307 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1307 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1307 may operate in accordance with other wireless protocols in other embodiments. Computing device 1300 may include an antenna 1313 to facilitate wireless communications and/or to receive other wireless communications (such as AM or FM radio transmissions).

In some embodiments, communication chip 1307 may manage wired communications, such as electrical, optical, or any other suitable communication protocols (e.g., the Ethernet). As noted above, communication chip 1307 may include multiple communication chips. For instance, a first communication chip 1307 may be dedicated to shorter-range wireless communications such as Wi-Fi or Bluetooth, and a second communication chip 1307 may be dedicated to longer-range wireless communications such as GPS, EDGE, GPRS, CDMA, WiMAX, LTE, EV-DO, or others. In some embodiments, a first communication chip 1307 may be dedicated to wireless communications, and a second communication chip 1307 may be dedicated to wired communications.

Computing device 1300 may include battery/power circuitry 1308. Battery/power circuitry 1308 may include one or more energy storage devices (e.g., batteries or capacitors) and/or circuitry for coupling components of computing device 1300 to an energy source separate from computing device 1300 (e.g., AC line power).

Computing device 1300 may include a display device 1303 (or corresponding interface circuitry, as discussed above). Display device 1303 may include any visual indicators, such as a heads-up display, a computer monitor, a projector, a touchscreen display, a liquid crystal display (LCD), a light-emitting diode display, or a flat panel display, for example.

Computing device 1300 may include an audio output device 1304 (or corresponding interface circuitry, as discussed above). Audio output device 1304 may include any device that generates an audible indicator, such as speakers, headsets, or earbuds, for example.

Computing device 1300 may include an audio input device 1310 (or corresponding interface circuitry, as discussed above). Audio input device 1310 may include any device that generates a signal representative of a sound, such as microphones, microphone arrays, or digital instruments (e.g., instruments having a musical instrument digital interface (MIDI) output).

Computing device 1300 may include a global positioning system (GPS) device 1309 (or corresponding interface circuitry, as discussed above). GPS device 1309 may be in communication with a satellite-based system and may receive a location of computing device 1300, as known in the art.

Computing device 1300 may include other output device 1305 (or corresponding interface circuitry, as discussed above). Examples of the other output device 1305 may include an audio codec, a video codec, a printer, a wired or wireless transmitter for providing information to other devices, or an additional storage device.

Computing device 1300 may include other input device 1311 (or corresponding interface circuitry, as discussed above). Examples of the other input device 1311 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1300 may include a security interface device 1312. Security interface device 1312 may include any device that provides security measures for computing device 1300 such as intrusion detection, biometric validation, security encode or decode, access list management, malware detection, or spyware detection.

Computing device 1300, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following embodiments pertain to further embodiments.

In one or more first embodiments, a memory device comprises a plurality of vertically aligned transistors, each of the transistors comprising an annular semiconductor structure coupled to an independent bit line, the transistors comprising a shared word line extending vertically through each of the annular semiconductor structures, and a plurality of vertically aligned capacitors, each of the capacitors comprising an annular first capacitor plate surrounding an annular capacitor dielectric, wherein each of the annular first capacitor plates are in contact with one of the annular semiconductor structures, the capacitors comprising a shared second capacitor plate extending vertically through each of the annular gate dielectric structures and the surrounding annular first capacitor plates.

In one or more second embodiments, further to the first embodiments, the word line comprises a first portion adjacent a first of the annular semiconductor structures, a second portion adjacent a second of the annular semiconductor structures, and a third portion between the first and second portions, and the third portion has a lateral width less than a lateral width of the first portion and less than a lateral width of the second portion.

In one or more third embodiments, further to the first or second embodiments, second capacitor plate comprises a first portion adjacent a first of the annular first capacitor plates, a second portion adjacent a second of the annular first capacitor plates, and a third portion between the first and second portions, wherein the third portion has a lateral width less than a lateral width of the first second portion and less than a lateral width of the third second portion.

In one or more fourth embodiments, further to the first through third embodiments, a first of the annular semiconductor structures comprises a first portion forming an outer ring of the first annular semiconductor structure and a second portion extending from the first portion into an interior of the first annular semiconductor structure.

In one or more fifth embodiments, further to the first through fourth embodiments, a first of the annular first capacitor plates comprises a first portion forming an outer ring of the first annular first capacitor plate and a second portion extending from the first portion into an interior of the first capacitor plate.

In one or more sixth embodiments, further to the first through fifth embodiments, each of the transistors further comprises an annular gate dielectric structure between the annular semiconductor structure and the word line.

In one or more seventh embodiments, further to the first through sixth embodiments, the memory device further comprises gate dielectric material on both of and extending between a first of the annular gate dielectric structures and a second of the annular gate dielectric structures.

In one or more eighth embodiments, further to the first through seventh embodiments, a centerline extending laterally through a center of the second capacitor plate and through a center of the word line is substantially orthogonal to a line defined by a length of a first of the independent bit lines.

In one or more ninth embodiments, further to the first through eighth embodiments, an angle between a line defined by a length of a first of the independent bit lines and a centerline extending laterally through a center of the second capacitor plate and through a center of the word line is between 50° and 70°.

In one or more tenth embodiments, further to the first through ninth embodiments, the line is at a second angle of between 25° and 35° with respect to an edge of an integrated circuit die comprising the vertically aligned transistors, the bit lines, the vertically aligned capacitors.

In one or more eleventh embodiments, further to the first through tenth embodiments, the semiconductor structures have a first lateral width, and the annular first capacitor plates have a second lateral width not more than 1.5 times the first lateral width.

In one or more twelfth embodiments, further to the first through tenth embodiments, the memory device further comprises a cooling structure operable to remove heat from an IC die comprising the semiconductor structures to achieve an operating temperature at or below −25° C.

In one or more thirteenth embodiments, further to the first through twelfth embodiments, the annular gate dielectric structures comprises one of titanium and oxygen, tantalum and oxygen, zirconium and oxygen, aluminum and oxygen, hafnium and oxygen, silicon and oxygen, silicon and carbon, gallium and nitrogen, strontium, titanium, and oxygen, barium, titanium, and oxygen, or barium, strontium, titanium, and oxygen.

In one or more fourteenth embodiments, a system comprises an IC die having a memory device according to any of the first through thirteenth embodiments, and a power supply coupled to the IC die.

In one or more fifteenth embodiments, an integrated circuit (IC) die comprises a one transistor-one capacitor dynamic random access memory (1T-TC DRAM) device, comprising a plurality of transistors each comprising an annular semiconductor structure coupled to a bit line, the transistors comprising a word line extending through each of the annular semiconductor structures, and a plurality of capacitors, each of the capacitors comprising an annular first capacitor plate surrounding an annular capacitor dielectric, wherein each of the annular first capacitor plates are in contact with a respective one of the annular semiconductor structures, the capacitors comprising a second capacitor plate extending through each of the annular gate dielectric structures and the surrounding annular first capacitor plates, and a power supply coupled to the IC die.

In one or more sixteenth embodiments, further to the fifteenth embodiments, the word line comprises a first portion adjacent a first of the annular semiconductor structures, a second portion adjacent a second of the annular semiconductor structures, and a third portion between the first and second portions, and the third portion has a lateral width less than a lateral width of the first second portion and less than a lateral width of the third second portion.

In one or more seventeenth embodiments, further to the fifteenth or sixteenth embodiments, a first of the annular semiconductor structures comprises a first portion forming an outer ring of the first annular semiconductor structure and a second portion extending from the first portion into an interior of the first annular semiconductor structure.

In one or more eighteenth embodiments, further to the fifteenth through seventeenth embodiments, an angle between a line defined by a length of a first of the bit lines and a centerline extending laterally through a center of the second capacitor plate and through a center of the word line is not less than 100°.

In one or more nineteenth embodiments, further to the fifteenth through eighteenth embodiments, the line is at a second angle of not more than 80° with respect to an edge of the IC die.

In one or more twentieth embodiments, a method comprises receiving a multilayer stack comprising interleaved first and second layers, the first and second layers comprising etch selectivity therebetween, forming a first via vertically through the multilayer stack, selectively etching first regions of the first layers, forming a semiconductor material on first exposed surfaces of the first layers, forming a gate metal within the first via, forming a second via vertically through the multilayer stack adjacent the first via, selectively etching second regions of the first layers, forming a first capacitor electrode material on exposed surfaces of the semiconductor material, and capacitor dielectric material on the capacitor electrode material, and forming a second capacitor electrode material within the second via.

In one or more twenty-first embodiments, further to the twentieth embodiments, said forming the semiconductor material comprises selectively depositing the semiconductor material on the first exposed surfaces.

In one or more twenty-second embodiments, further to the twentieth or twenty-first embodiments, said forming the semiconductor material comprises bulk deposition of the semiconductor material and etch of the deposited semiconductor material to expose regions of the second layers.

In one or more twenty-third embodiments, further to the twentieth through twenty-second embodiments, said forming the first via comprises a dry etch and said selectively etching the first regions comprises a wet etch.

In one or more twenty-fourth embodiments, further to the twentieth through twenty-third embodiments, the first layers comprise silicon and oxygen, and the second layers comprise silicon and nitrogen.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A memory device, comprising:
a plurality of vertically aligned transistors, each of the transistors comprising an annular semiconductor structure coupled to an independent bit line,
the transistors comprising a shared word line extending vertically through each of the annular semiconductor structures, wherein the word line comprises a first portion adjacent a first of the annular semiconductor structures, a second portion adjacent a second of the annular semiconductor structures, and a third portion between the first and second portions, wherein the third portion has a lateral width less than a lateral width of the first portion and less than a lateral width of the second portion; and
a plurality of vertically aligned capacitors, each of the capacitors comprising an annular first capacitor plate surrounding an annular capacitor dielectric structure, wherein each of the annular first capacitor plates are in contact with one of the annular semiconductor structures,
the capacitors comprising a shared second capacitor plate extending vertically through each of the annular capacitor dielectric structures and the surrounding annular first capacitor plates.

2. The memory device of claim 1, wherein the second capacitor plate comprises a first portion adjacent a first of the annular first capacitor plates, a second portion adjacent a second of the annular first capacitor plates, and a third portion between the first and second portions, wherein the third portion has a lateral width less than a lateral width of the first portion and less than a lateral width of the second portion.

3. The memory device of claim 1, wherein a first of the annular semiconductor structures comprises a first portion forming an outer ring of the first annular semiconductor structure and a second portion extending from the first portion into an interior of the first annular semiconductor structure.

4. The memory device of claim 1, wherein a first of the annular first capacitor plates comprises a first portion forming an outer ring of the first annular first capacitor plate and a second portion extending from the first portion into an interior of the first capacitor plate.

5. The memory device of claim 1, wherein each of the transistors further comprises an annular gate dielectric structure between the annular semiconductor structure and the word line.

6. The memory device of claim 5, further comprising gate dielectric material on both of and extending between a first of the annular gate dielectric structures and a second of the annular gate dielectric structures.

7. The memory device of claim 1, wherein a centerline extending laterally through a center of the second capacitor plate and through a center of the word line is substantially orthogonal to a line defined by a length of a first of the independent bit lines.

8. The memory device of claim 1, wherein an angle between a line defined by a length of a first of the independent bit lines and a centerline extending laterally through a center of the second capacitor plate and through a center of the word line is between 50° and 70°.

9. The memory device of claim 8, wherein the line is at a second angle of between 25° and 35° with respect to an edge of an integrated circuit die comprising the vertically aligned transistors, the independent bit lines, and the vertically aligned capacitors.

10. The memory device of claim 1, wherein the annular semiconductor structures have a first lateral width, and the annular first capacitor plates have a second lateral width not more than 1.5 times the first lateral width.

11. The memory device of claim 10, further comprising:
   a cooling structure operable to remove heat from an IC die comprising the annular semiconductor structures to achieve an operating temperature at or below −25° C.

12. The memory device of claim 1, wherein the annular capacitor dielectric structures comprise one of titanium and oxygen, tantalum and oxygen, zirconium and oxygen, aluminum and oxygen, hafnium and oxygen, silicon and oxygen, silicon and carbon, gallium and nitrogen, strontium, titanium, and oxygen, barium, titanium, and oxygen, or barium, strontium, titanium, and oxygen.

13. A system, comprising:
   an integrated circuit (IC) die comprising a one transistor-one capacitor dynamic random access memory (1T-TC DRAM) device, comprising:
      a plurality of transistors each comprising an annular semiconductor structure coupled to a bit line,
      the transistors comprising a word line extending through each of the annular semiconductor structures, wherein the word line comprises a first portion adjacent a first of the annular semiconductor structures, a second portion adjacent a second of the annular semiconductor structures, and a third portion between the first and second portions, wherein the third portion has a lateral width less than a lateral width of the first portion and less than a lateral width of the second portion; and
      a plurality of capacitors, each of the capacitors comprising an annular first capacitor plate surrounding an annular capacitor dielectric, wherein each of the annular first capacitor plates are in contact with a respective one of the annular semiconductor structures,
      the capacitors comprising a second capacitor plate extending through each of the annular capacitor dielectrics and the surrounding annular first capacitor plates; and
   a power supply coupled to the IC die.

14. The system of claim 13, wherein a first of the annular semiconductor structures comprises a first portion forming an outer ring of the first annular semiconductor structure and a second portion extending from the first portion into an interior of the first annular semiconductor structure.

15. The system of claim 13, wherein an angle between a line defined by a length of a first of the bit lines and a centerline extending laterally through a center of the second capacitor plate and through a center of the word line is not less than 100°.

16. The system of claim 15, wherein the line is at a second angle of not more than 80° with respect to an edge of the IC die.

17. A memory device, comprising:
   a plurality of transistors each comprising an annular semiconductor structure coupled to a bit line, the transistors comprising a word line extending through each of the annular semiconductor structures, wherein the word line comprises a first portion adjacent a first of the annular semiconductor structures, a second portion adjacent a second of the annular semiconductor structures, and a third portion between the first and second portions, wherein the third portion has a lateral width less than a lateral width of the first portion and less than a lateral width of the second portion; and
   a plurality of capacitors, each of the capacitors comprising an annular first capacitor plate surrounding an annular capacitor dielectric, wherein each of the annular first capacitor plates are in contact with a respective one of the annular semiconductor structures,
   the capacitors comprising a second capacitor plate extending through each of the annular capacitor dielectrics and the surrounding annular first capacitor plates.

18. The memory device of claim 17, wherein the second capacitor plate comprises a first portion adjacent a first of the annular first capacitor plates, a second portion adjacent a second of the annular first capacitor plates, and a third portion between the first and second portions, wherein the third portion has a lateral width less than a lateral width of the first portion and less than a lateral width of the second portion.

19. The memory device of claim 17, wherein a first of the annular semiconductor structures comprises a first portion forming an outer ring of the first annular semiconductor structure and a second portion extending from the first portion into an interior of the first annular semiconductor structure.

20. The memory device of claim 17, wherein a first of the annular first capacitor plates comprises a first portion forming an outer ring of the first annular first capacitor plate and a second portion extending from the first portion into an interior of the first capacitor plate.

21. The memory device of claim 17, wherein each of the transistors further comprises an annular gate dielectric structure between the annular semiconductor structure and the word line.

22. The memory device of claim 17, wherein a centerline extending laterally through a center of the second capacitor plate and through a center of the word line is substantially orthogonal to a line defined by a length of a first of the bit lines.

23. The memory device of claim 17, further comprising:
an integrated circuit (IC) die comprising the transistors and the capacitors; and
a power supply coupled to the IC die.

* * * * *